(12) United States Patent
Nakayama et al.

(10) Patent No.: US 10,279,591 B2
(45) Date of Patent: May 7, 2019

(54) MANUFACTURING METHOD OF LIQUID EJECTING HEAD CHIP

(71) Applicant: SII Printek Inc., Chiba-shi, Chiba (JP)

(72) Inventors: Hitoshi Nakayama, Chiba (JP); Takeshi Sugiyama, Chiba (JP); Daichi Nishikawa, Chiba (JP); Eriko Maeda, Chiba (JP)

(73) Assignee: SII PRINTEK INC., Chiba (JP)

( * ) Notice: Subject to any disclaimer, the term of this patent is extended or adjusted under 35 U.S.C. 154(b) by 0 days.

(21) Appl. No.: 15/924,725

(22) Filed: Mar. 19, 2018

(65) Prior Publication Data

US 2018/0272714 A1 Sep. 27, 2018

(30) Foreign Application Priority Data

Mar. 22, 2017 (JP) .................................. 2017-056389

(51) Int. Cl.
*B41J 2/16* (2006.01)
*B41J 2/14* (2006.01)
(Continued)

(52) U.S. Cl.
CPC ......... *B41J 2/1643* (2013.01); *B41J 2/14209* (2013.01); *B41J 2/1607* (2013.01);
(Continued)

(58) Field of Classification Search
CPC ...... B41J 2/1643; B41J 2/1623; B41J 2/1635; B41J 2/1607; B41J 2/1629; B41J 2/1631; B41J 2/14209; B41J 2/1609; B41J 2/1632; B41J 2/1634; B41J 2/1642; B41J 2002/14491; H01L 41/047; H01L 41/29; H01L 41/09; H01L 41/1876; G03F 7/16; C23C 18/42; C23C 18/32; C23C 18/1605
See application file for complete search history.

(56) References Cited

U.S. PATENT DOCUMENTS

2010/0177133 A1 7/2010 Makishima
2013/0271531 A1 10/2013 Koseki
(Continued)

FOREIGN PATENT DOCUMENTS

| EP | 0484983 A2 | 5/1992 |
|---|---|---|
| JP | 2014-233875 A | 12/2014 |
| JP | 2015-171804 A | 10/2015 |

OTHER PUBLICATIONS

Extended European Search Report dated Aug. 24, 2018, pp. 1-11.

*Primary Examiner* — Kyoung Lee
(74) *Attorney, Agent, or Firm* — Brinks Gilson & Lione

(57) ABSTRACT

A discharge channel and a non-discharge channel are formed to have a similar shape, that is, to include extension portions and raise-and-cut portions continuing from end portions of both the extension portions, respectively. Then, imparting of a catalyst, washing of an unnecessary catalyst, plating, and the like are performed on a target surface, as a plating step. In an embodiment, an electrode clearance groove is formed after the plating step. Since channel grooves for the discharge channel and the non-discharge channel have a similar shape, it is possible to cause a water flow to uniformly flow in the channels when washing is performed, and thus to avoid an occurrence of a situation in which a lump is formed in the channel groove by plating.

4 Claims, 24 Drawing Sheets

(51) Int. Cl.

| | |
|---|---|
| *C23C 18/16* | (2006.01) |
| *C23C 18/32* | (2006.01) |
| *C23C 18/42* | (2006.01) |
| *G03F 7/16* | (2006.01) |
| *H01L 41/047* | (2006.01) |
| *H01L 41/09* | (2006.01) |
| *H01L 41/29* | (2013.01) |
| *H01L 41/187* | (2006.01) |

(52) U.S. Cl.
CPC ........... *B41J 2/1609* (2013.01); *B41J 2/1623* (2013.01); *B41J 2/1629* (2013.01); *B41J 2/1631* (2013.01); *B41J 2/1632* (2013.01); *B41J 2/1634* (2013.01); *B41J 2/1635* (2013.01); *B41J 2/1642* (2013.01); *C23C 18/1605* (2013.01); *C23C 18/32* (2013.01); *C23C 18/42* (2013.01); *G03F 7/16* (2013.01); *H01L 41/047* (2013.01); *H01L 41/09* (2013.01); *H01L 41/29* (2013.01); *B41J 2002/14491* (2013.01); *H01L 41/1876* (2013.01)

(56) References Cited

U.S. PATENT DOCUMENTS

| | | |
|---|---|---|
| 2014/0218444 A1 | 8/2014 | Harajiri et al. |
| 2015/0158299 A1* | 6/2015 | Nishikawa ........... B41J 2/14209 347/50 |
| 2015/0258790 A1 | 9/2015 | Tatsumi et al. |
| 2015/0258792 A1 | 9/2015 | Tatsumi et al. |

\* cited by examiner

MANUFACTURING METHOD OF LIQUID EJECTING HEAD CHIP

RELATED APPLICATIONS

This application claims priority under 35 U.S.C. § 119 to Japanese Patent Application No. 2017-056389 filed on Mar. 22, 2017, the entire content of which is hereby incorporated by reference.

BACKGROUND OF THE INVENTION

Field of the Invention

The present invention relates to a manufacturing method of a liquid ejecting head chip.

Background Art

In the related art, as an apparatus that records an image or letters on a recording medium by discharging (ejecting) a droplet-like ink to the recording medium such as a recording sheet, an ink jet printer (liquid ejecting apparatus) including an ink jet head (liquid ejecting head) is provided.

In the ink jet head, channel groove working for an ejection channel and a non-ejection channel is performed on a piezoelectric (for example, PZT) base material, and electrodes are formed on the inside and the surface of a channel groove are formed. An ink is discharged from the ejection channel by driving the electrodes.

The ink jet head is configured by assembling two kinds of plates of an actuator plate and a cover plate. In the actuator plate, a channel groove is driven. In the cover plate, an ink flow passage is formed by covering a portion of an upper portion of the channel groove.

A driving electrode is formed in the actuator plate. When the actuator plate and the cover plate are assembled, wiring is formed by the driving electrode coming into contact with an electrode on the cover plate side.

A technology of forming an electrode clearance groove (which is shallower than a channel groove of the non-ejection channel) in a direction across the channel groove and then forming an electrode, in order to prevent an occurrence of a short circuit between electrodes which are near to each other and face each other when wafers are assembled, is proposed (refer to JP2014-233875A).

However, in the technology disclosed in JP2014-233875A, an electrode is formed by an oblique vapor deposition method. Thus, if the width of the channel groove is reduced by an increase in density of nozzles (channels) in the ink jet head, the wall between grooves acts as a shadow, and the electrode can be formed in a groove at only the depth of about twice the width of the channel groove. In addition, if the channel groove is formed to be shallow, it is not possible to generate sufficient power required for driving.

Thus, regarding electrode forming by an oblique vapor deposition, electrode forming by a plating method which can correspond to a deeper groove is considered. That is, a technology in which electrode clearance groove working for preventing an occurrence of a short circuit is performed and then an electrode is formed by a plating method (electroless plating) is considered.

SUMMARY OF THE INVENTION

In electroless plating, a catalyst is imparted to a target surface, and then an unnecessary catalyst is removed by rinsing. However, the degree of removing the catalyst by rinsing largely varies depending on the shape of a plating target.

Therefore, if the electrode clearance groove is previously formed, a washing liquid in the channel groove of the non-ejection channel is caused to flow toward the electrode clearance groove. Thus, a liquid flow in the groove for the non-ejection channel may be disturbed, a lump may be formed by insufficient washing of the groove for the non-ejection channel, or a place in which an electrode is not formed by precipitation may be locally provided by deficiency of the catalyst which occurs by excessive washing, in accordance with the depth of the electrode clearance groove.

In the technology disclosed in JP2014-233875A, among channel grooves (ejection channel groove and non-ejection channel groove), the ejection channel groove has a raise-and-cut shape, but the non-ejection channel groove has a cut-off shape. That is, both channel grooves have shapes different from each other. Here, the raise-and-cut shape is a shape in which the depth of a groove is gradually reduced up to zero from the middle. The cut-off shape is a shape in which the depth of a groove is uniform to the end portion thereof. Therefore, even in a case where electroless plating is performed in a state where the electrode clearance groove is not formed, since both the channel grooves have different shapes, a difference in an amount of a washing liquid flowing in the channel groove occurs. As a result, a lump may be formed by insufficient washing or a place in which an electrode is not formed by precipitation may be provided by excessive washing.

In the technology disclosed in JP2014-233875A, a groove for forming a driving electrode includes the non-ejection channel groove and the ejection channel groove, and the non-ejection channel groove has a cut-off shape. Thus, there is a problem in that a wafer is easily broken at the non-ejection channel groove portion in a groove direction.

The applicant of the present disclosure has applied a technology in which both a non-ejection channel groove and an ejection channel groove are set to have the same raise-and-cut shape, and thus an unevenness of a washing liquid flowing in both the grooves in plating is suppressed and breaking at the non-ejection channel groove portion is suppressed (refer to Japanese Patent Application No. 2017-018236).

However, if an electrode clearance groove across the non-ejection channel groove is formed even though both the non-ejection channel groove and the ejection channel groove have a raise-and-cut shape, the washing liquid flows more in the electrode clearance groove than the non-ejection channel groove and the ejection channel groove, and an effect of forming both the channel grooves to have a similar shape is not exhibited.

An object of the present disclosure is to provide a manufacturing method in which it is difficult to form a plating lump in a formed channel groove.

(1) According to a first aspect of the disclosure, there is provided a manufacturing method of a liquid ejecting head chip which includes an actuator plate in which parts are formed on an actuator plate-side first main surface directed toward a third direction among a first direction, a second direction, and the third direction being orthogonal to each other, and a cover plate bonded to the actuator plate-side first main surface of the actuator plate. The parts of the actuator plate include a plurality of ejection channels and non-ejection channels which are formed in the first direction and are alternately arranged in parallel at a distance in the second direction, a common electrode formed in an inner circumferential surface of each of the ejection channels with a plating film, an individual electrode formed on both side surfaces of an inner side of each of the non-ejection channels with a plating film, a plurality of actuator plate-side common pads which are formed on the actuator plate-side first main surface with a plating film, extend from common electrodes, and are disposed to be spaced from each other in the second direction, respectively, in a portion positioned on one side relative to the ejection channels in the first direction, an actuator plate-side individual wiring which is formed on the actuator plate-side first main surface with a plating film and connects individual electrodes facing each other with one of the ejection channels interpose between the individual electrodes, and an electrode clearance groove formed in the second direction between the actuator plate-side common pads and the actuator plate-side individual wiring, on one side of the actuator plate in the first direction. The manufacturing method includes a mask pattern forming step of forming a mask pattern for the plurality of actuator plate-side common pads and the actuator plate-side individual wirings, on the actuator plate-side first main surface of the actuator plate, a channel groove forming step of forming channel grooves of the ejection channels and the non-ejection channels at a portion of the actuator plate-side first main surface, at which the mask pattern is formed, by cutting, a plating step of forming a plating film by performing catalyst impartation, washing, and plating on the actuator plate on which cutting is performed in the channel groove forming step, so as to integrally form the common electrode, the individual electrode, the actuator plate-side common pads, and the actuator plate-side individual wirings, a clearance groove forming step of forming the electrode clearance groove between the actuator plate-side common pads and the actuator plate-side individual wirings which are integrally formed in the plating step, on the actuator plate-side first main surface by cutting, and an individual electrode separation step of separating individual electrodes formed on both side surfaces facing each other, from each other on the inner side of the non-ejection channel.

(2) According to a second aspect of the disclosure, there is provided the manufacturing method of a liquid ejecting head chip described in the first aspect, in which the plating step includes a roughening step of roughening a surface on which the plating film is to be formed, before the plating film is formed.

(3) According to a third aspect of the disclosure, there is provided the manufacturing method of a liquid ejecting head chip described in the first or second aspect, in which, in the channel groove forming step, the channel groove which includes an extension portion extending in the first direction, and a raise-and-cut portion continuing from the extension portion toward one side of the first direction and having a groove depth which gradually becomes shallow while being raised toward the one side of the first direction.

According to the present disclosure, since an electrode is formed after electrode clearance groove working, it is possible to suppress lift-off of a piezoelectric base material by clearance groove working.

DETAILED DESCRIPTION OF THE INVENTION

Figure 1:
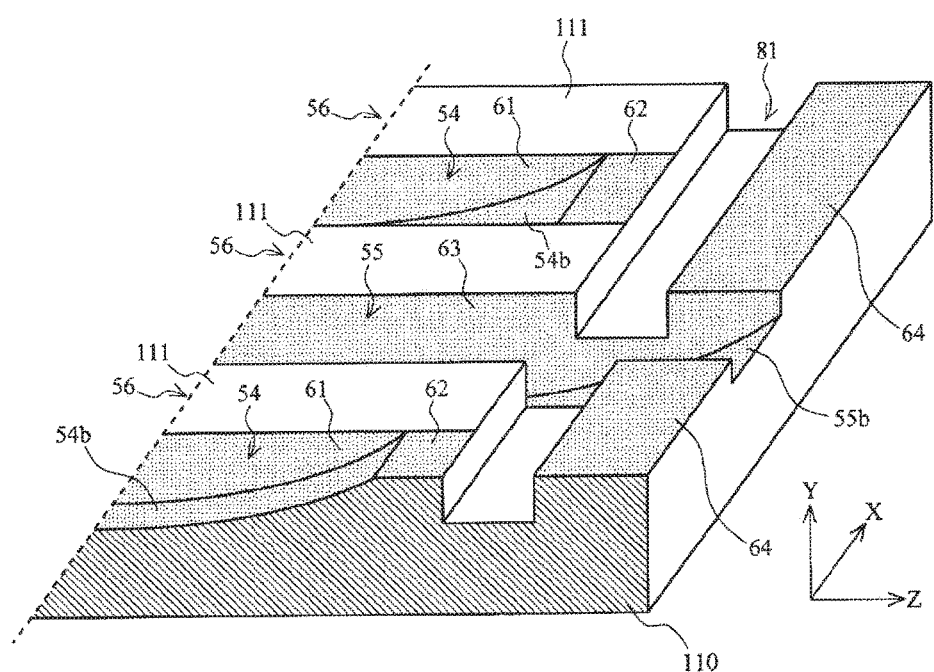
FIG. 1 is a perspective view illustrating an electrode clearance groove formed in an actuator plate according to an embodiment.

Hereinafter, an embodiment according to the present disclosure will be described with reference to the drawings. In the embodiment, as an example of a liquid ejecting apparatus which includes a liquid ejecting head including a liquid ejecting head chip (simply referred to as "a head chip" below) according to the present disclosure, an ink jet printer (simply referred to as "a printer" below) that performs recording on a recording medium by using an ink (liquid) will be described. In the drawings used in the following descriptions, members are assumed to have a size which allows recognition of each of the members. Thus, the scale of each of the members is appropriately changed.

(1) Overall of Embodiment

Figure 8:
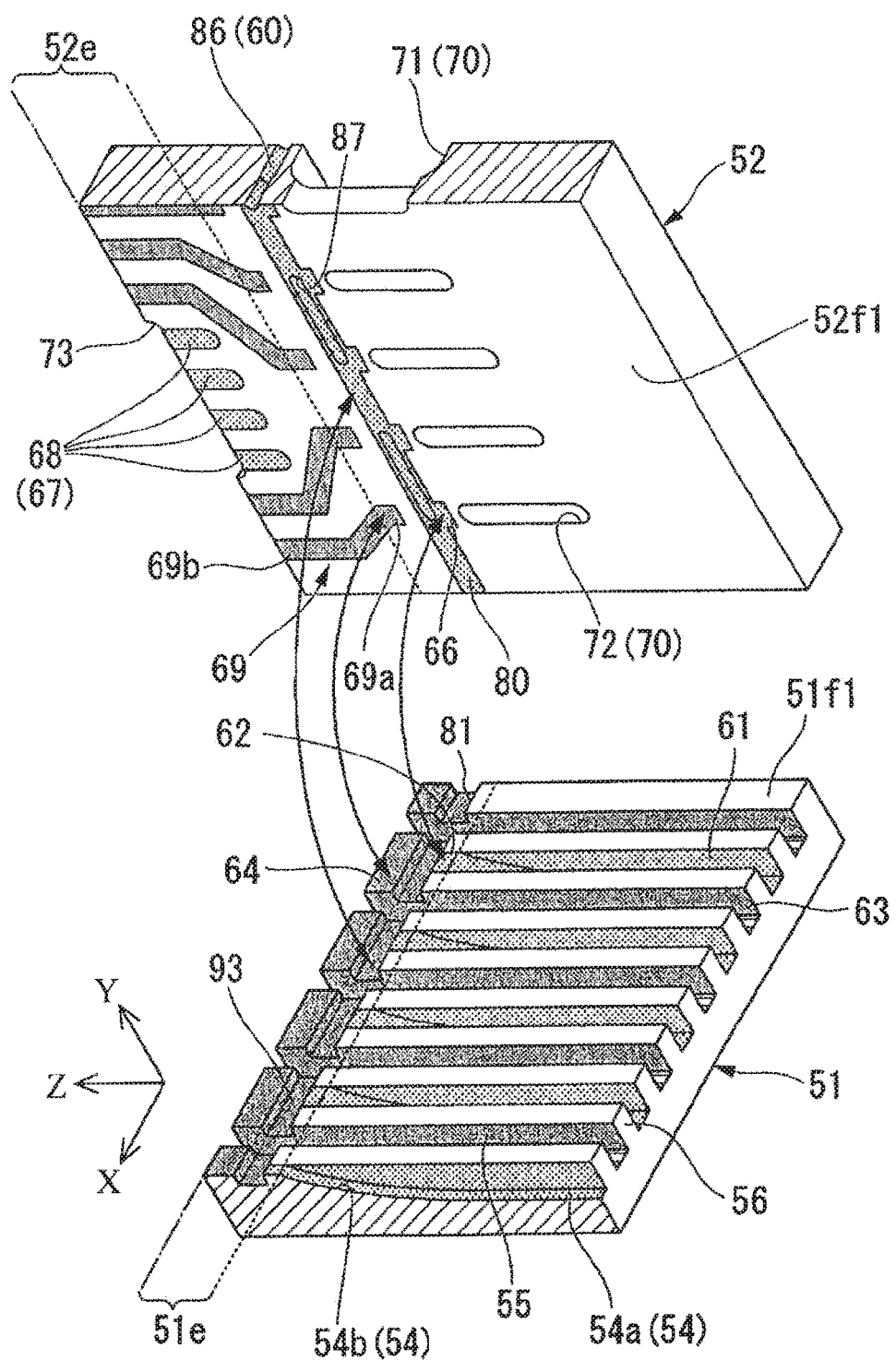
FIG. 8 is an exploded perspective view illustrating a head chip in the embodiment.

According to the embodiment, an ink jet head (liquid ejecting head) includes an actuator plate 51 and a cover plate 52 (see FIG. 8). As illustrated in FIG. 1, channel grooves for a discharge channel (ejection channel) 54 and a non-discharge channel (non-ejection channel) 55 in a Z-direction are formed on the front surface of the actuator plate 51, so as to be alternately arranged in an X-direction, by cutting with a dicing blade or the like.

In the embodiment, the discharge channel 54 and the non-discharge channel 55 are formed to have a similar shape. That is, the discharge channel 54 and the non-discharge channel 55 include extension portions 54a and 55a and raise-and-cut portions 54b and 55b continuing from end portions of both the extension portions 54a and 55a, respectively.

Imparting of a catalyst, washing of an unnecessary catalyst, plating, and the like are performed on a target surface of the actuator plate 51, on which the channel grooves are formed, as a plating step.

In an embodiment, an electrode clearance groove 81 is formed after the plating step.

As described above, according to the manufacturing method of an ink jet head in the embodiment, the discharge channel 54 and the non-discharge channel 55 are formed to respectively have raise-and-cut portions 54b and 55b continuing to extension portions 54a and 55a, that is, formed to have a similar shape.

In the embodiment, not the electrode clearance groove 81 is previously formed, but the plating step is performed before the electrode clearance groove 81 is formed. Therefore, regarding the channel grooves for the discharge channel 54 and the non-discharge channel 55 having the similar shape, it is possible to cause a water flow to uniformly flow in the channels when washing is performed, and thus to avoid an occurrence of a situation in which a lump is formed in the channel groove by plating.

(2) Details of Embodiment

Printer

Figure 2:
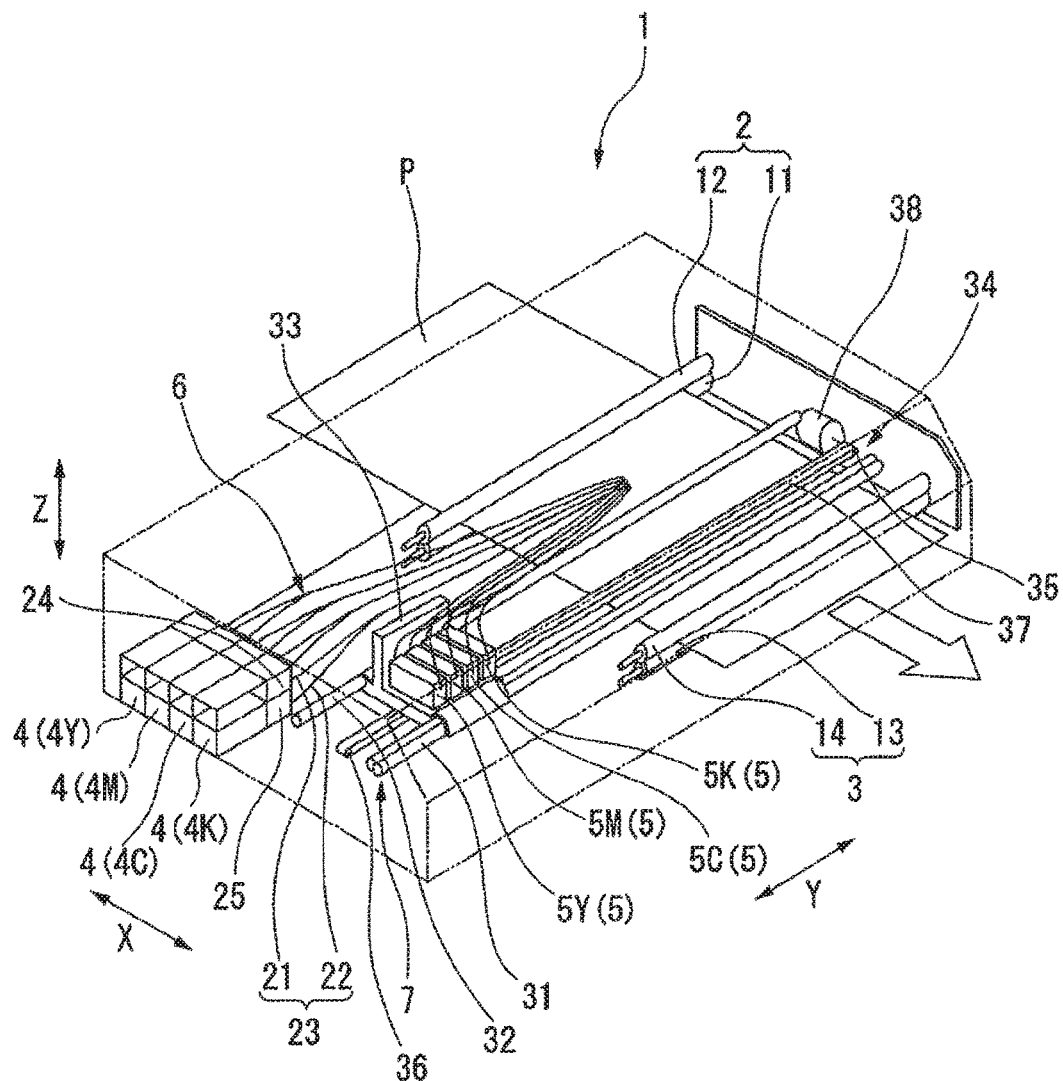
FIG. 2 is a schematic configuration diagram illustrating an ink jet printer according to the embodiment.

FIG. 2 is a schematic configuration diagram illustrating a printer 1.

As illustrated in FIG. 2, the printer 1 in the embodiment includes a pair of transporting means 2 and 3, an ink tank 4, an ink jet head (liquid ejecting head) 5, ink circulation means 6, and scanning means 7. In the following descriptions, descriptions will be made, if necessary, by using an orthogonal coordinates system of X, Y, and Z. An X-direction is a transport direction of a recording medium P (for example, paper). A Y-direction is a scanning direction of the scanning means 7. A Z-direction is a vertical direction which is orthogonal to the X-direction and the Y-direction.

The transporting means 2 and 3 transport the recording medium P in the X-direction. Specifically, the transporting means 2 includes a grit roller 11, a pinch roller 12, and a driving mechanism (not illustrated) such as a motor. The grit roller 11 is provided to extend in the Y-direction. The pinch roller 12 is provided to extend in parallel to the grit roller 11. The driving mechanism rotates the shaft of the grit roller 11 so as to rotate the grit roller 11. The transporting means 3 includes a grit roller 13, a pinch roller 14, and a driving mechanism (not illustrated). The grit roller 13 is provided to extend in the Y-direction. The pinch roller 14 is provided to extend in parallel to the grit roller 13. The driving mechanism (not illustrated) rotates the shaft of the grit roller 13 so as to rotate the grit roller 13.

A plurality of ink tanks 4 are provided to be arranged in one direction. In the embodiment, the plurality of ink tanks 4 respectively correspond to ink tanks 4Y, 4M, 4C, and 4K that accommodate inks of four colors which are yellow, magenta, cyan, and black. In the embodiment, the ink tanks 4Y, 4M, 4C, and 4K are disposed side by side in the X-direction.

Figure 3:
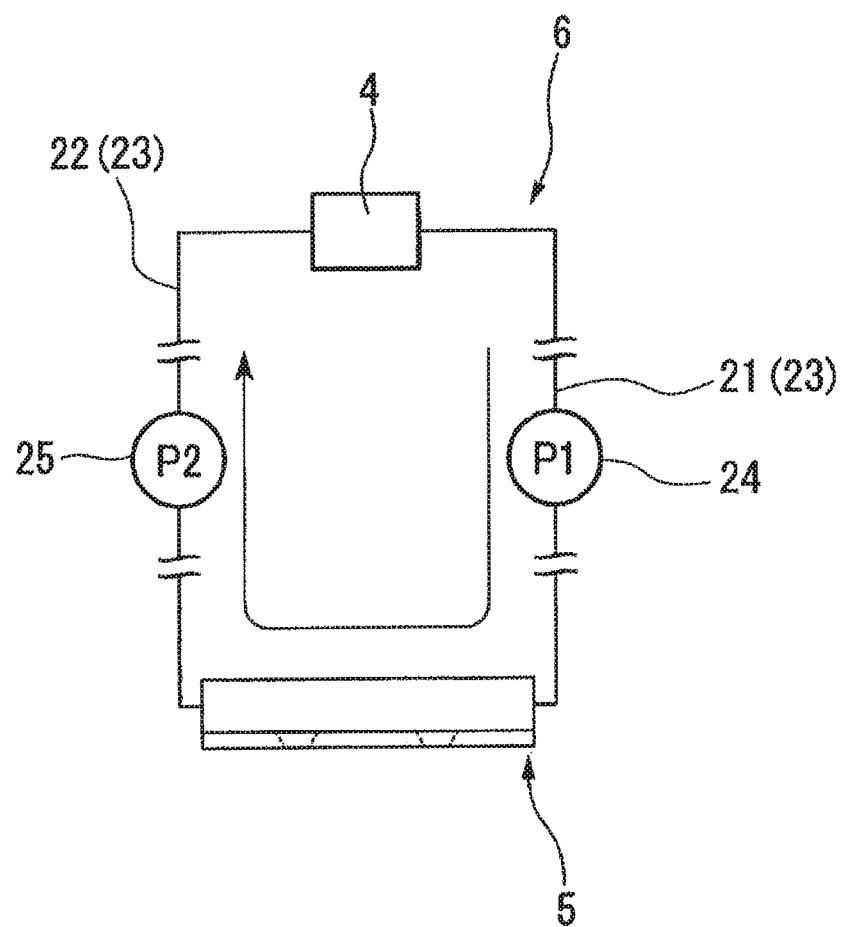
FIG. 3 is a schematic configuration diagram illustrating an ink jet head and ink circulation means in the embodiment.

As illustrated in FIG. 3, the ink circulation means 6 is configured to circulate an ink between the ink tank 4 and the ink jet head 5. Specifically, the ink circulation means 6 includes a circulation flow passage 23, a pressure pump 24, and a suction pump 25. The circulation flow passage 23 includes an ink supply tube 21 and an ink discharge tube 22. The pressure pump 24 is connected to the ink supply tube 21. The suction pump 25 is connected to the ink discharge tube 22. For example, the ink supply tube 21 and the ink discharge tube 22 are configured by a flexible hose which has flexibility and can follow an operation of the scanning means 7 for supporting the ink jet head 5.

The pressure pump 24 applies pressure to the inside of the ink supply tube 21, and thus an ink is sent to the ink jet head 5 through the ink supply tube 21. Thus, the ink supply tube 21 side has positive pressure in comparison to the ink jet head 5.

The suction pump 25 depressurizes the ink discharge tube 22, and thus suctions an ink from the ink jet head 5 through the ink discharge tube 22. Thus, the ink discharge tube 22 side has negative pressure in comparison to the ink jet head 5. The ink may be circulated between the ink jet head 5 and the ink tank 4 through the circulation flow passage 23, by driving of the pressure pump 24 and the suction pump 25.

As illustrated in FIG. 2, the scanning means 7 causes the ink jet head 5 to perform scanning with reciprocating, in the Y-direction. Specifically, the scanning means 7 includes a pair of guide rails 31 and 32, a carriage 33, and a driving mechanism 34. The guide rails 31 and 32 are provided to extend in the Y-direction. The carriage 33 is supported so as to be able to move on the pair of the guide rails 31 and 32. The driving mechanism 34 moves the carriage 33 in the Y-direction. The transporting means 2 and 3, and the scanning means 7 function as a moving mechanism that relatively moves the ink jet head 5 and the recording medium P.

The driving mechanism 34 is disposed between the guide rails 31 and 32 in the X-direction. The driving mechanism 34 includes a pair of pulleys 35 and 36, an endless belt 37, and a driving motor 38. The pair of pulleys 35 and 36 is arranged at a distance in the Y-direction. The endless belt 37 is wound around the pair of pulleys 35 and 36. The driving motor 38 rotates and drives one pulley 35.

The carriage 33 is linked to the endless belt 37. A plurality of ink jet heads 5 are mounted in the carriage 33. In the embodiment, the plurality of ink jet heads 5 respectively correspond to ink jet heads 5Y, 5M, 5C, and 5K that discharge inks of four colors which are yellow, magenta, cyan, and black. In the embodiment, the ink jet heads 5Y, 5M, 5C, and 5K are disposed side by side in the Y-direction.

Ink Jet Head

Figure 4:
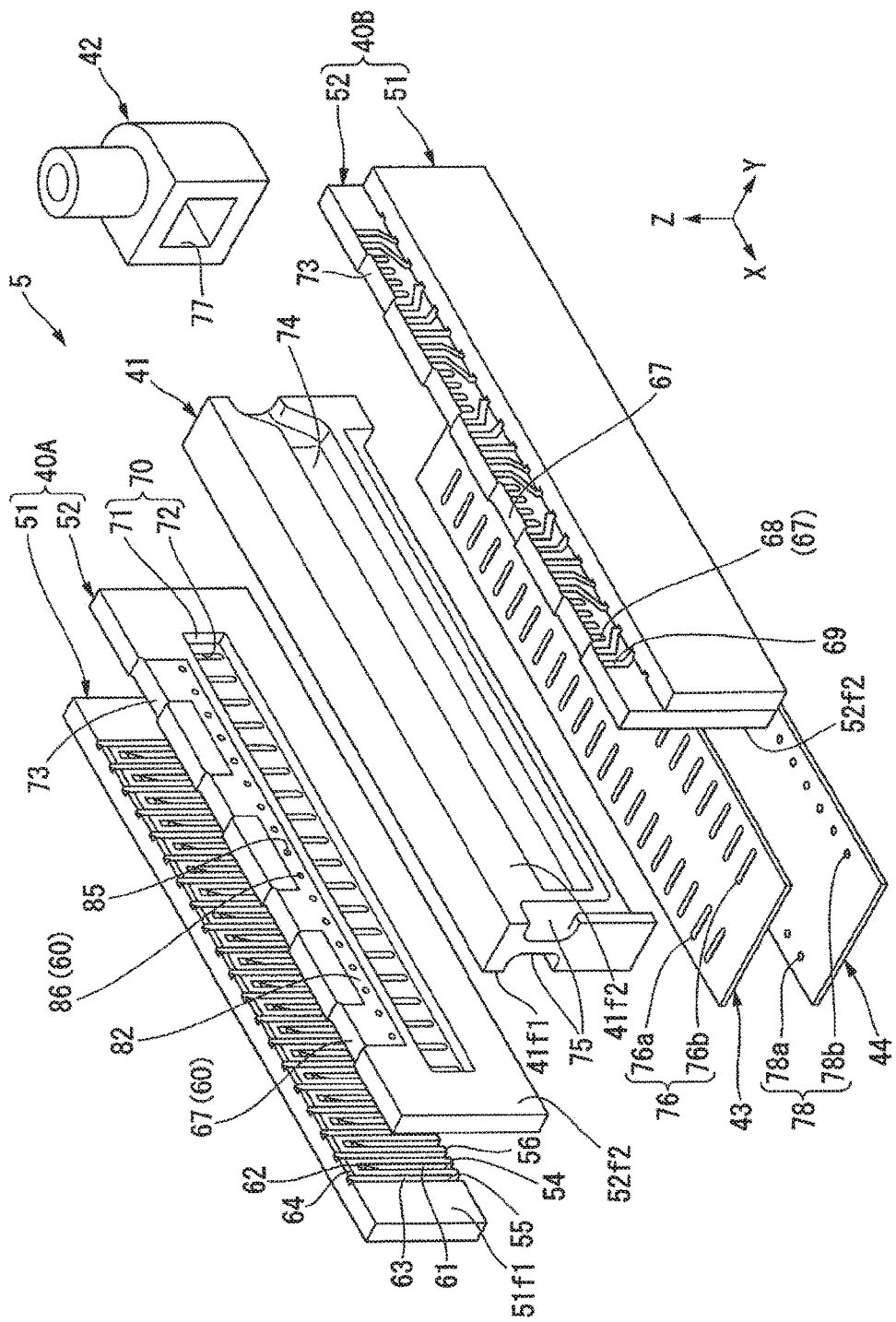
FIG. 4 is an exploded perspective view illustrating the ink jet head in the embodiment.

As illustrated in FIG. 4, the ink jet head 5 includes a pair of head chips 40A and 40B, a flow passage plate 41, an inlet manifold 42, an outlet manifold (not illustrated), a return plate 43, and a nozzle plate (ejection plate) 44. As the ink jet head 5, a circulation type (edge shoot circulation type) of circulating an ink between the ink jet head 5 and the ink tank 4, in a so-called edge shoot type of discharging an ink from the tip end portion of the discharge channel 54 in a channel extension direction is provided.

Head Chip

A pair of head chips 40A and 40B is a first head chip 40A and a second head chip 40B. Descriptions will be made below focusing on the first head chip 40A. In the second head chip 40B, component which are the same as those of the first head chip 40A are denoted by the same reference signs, and detailed descriptions thereof will not be repeated.

The first head chip 40A includes an actuator plate 51 and a cover plate 52.

Actuator Plate

The appearance of the actuator plate 51 is a rectangular plate shape which is long in the X-direction and is short in the Z-direction. In the embodiment, the actuator plate 51 is a so-called Chevron type stacked substrate in which two piezoelectric substrates having polarization directions which are different from each other in a thickness direction (Y-direction) are stacked (see FIG. 7). For example, a ceramics substrate formed of PZT (lead titanate zirconate) or the like is suitably used as the piezoelectric substrate.

A plurality of channels 54 and 55 are formed in a first main surface (actuator plate-side first main surface) of the actuator plate 51 in the Y-direction. In the embodiment, the actuator plate-side first main surface refers to an inner side surface 51f1 of the actuator plate 51 in the Y-direction (referred to as "an AP-side-Y-direction inner side surface 51f1" below). Here, the inner side in the Y-direction means the center side of the ink jet head 5 in the Y-direction (the flow passage plate 41 side in the Y-direction). In the embodiment, an actuator plate-side second main surface is an outer side surface of the actuator plate 51 in the Y-direction (indicated by the reference sign of 51f2 in FIG. 4).

Each of the channels 54 and 55 is formed to have a straight-line shape which extends in the Z-direction (first direction). The channels 54 and 55 are alternately formed to be spaced from each other in the X-direction (second direction). The channels 54 and 55 are separated from each other by a drive wall 56 formed by the actuator plate 51. One channel 54 is a discharge channel (ejection channel) 54 with which an ink is filled. The other channel 55 is a non-discharge channel (non-ejection channel) 55 with which an ink is not filled.

An upper end portion of the discharge channel 54 is terminated in the actuator plate 51. A lower end portion of the discharge channel 54 is opened in a lower end surface of the actuator plate 51.

Figure 5:
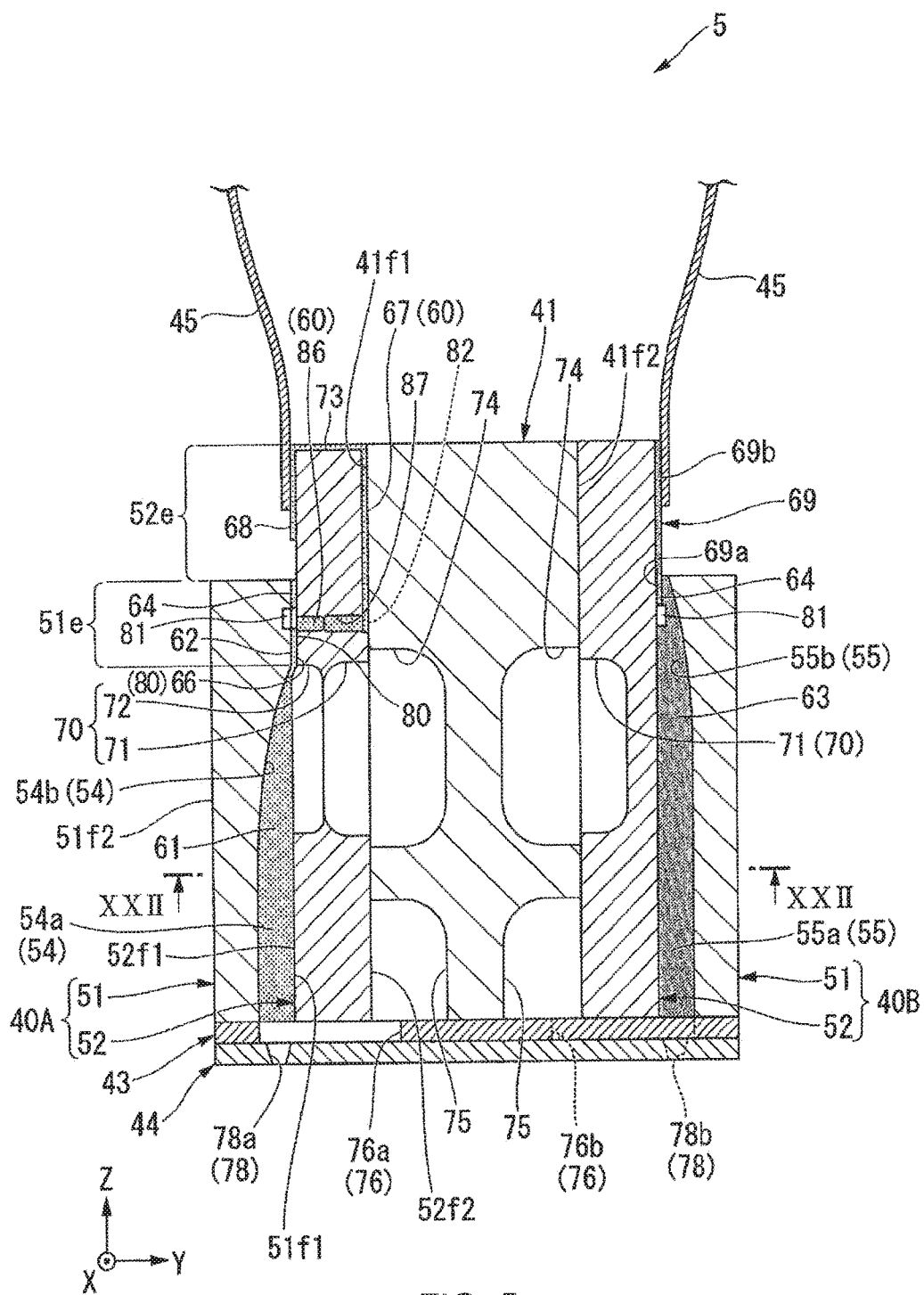
FIG. 5 is a sectional view illustrating the ink jet head in the embodiment.

FIG. 5 is a diagram illustrating a section of the discharge channel 54 in the first head chip 40A.

As illustrated in FIG. 5, the discharge channel 54 includes an extension portion 54a positioned at the lower end portion of the discharge channel 54, and a raise-and-cut portion 54b which continues upward from the extension portion 54a.

The extension portion 54a has a groove depth which is constant over the entirety thereof in the Z-direction. The raise-and-cut portion 54b has a groove depth which gradually becomes shallow while being raised upwardly.

As illustrated in FIG. 4, an upper end portion of the non-discharge channel 55 is opened in the upper end surface of the actuator plate 51. A lower end portion of the non-discharge channel 55 is opened in the lower end surface of the actuator plate 51.

Figure 6:
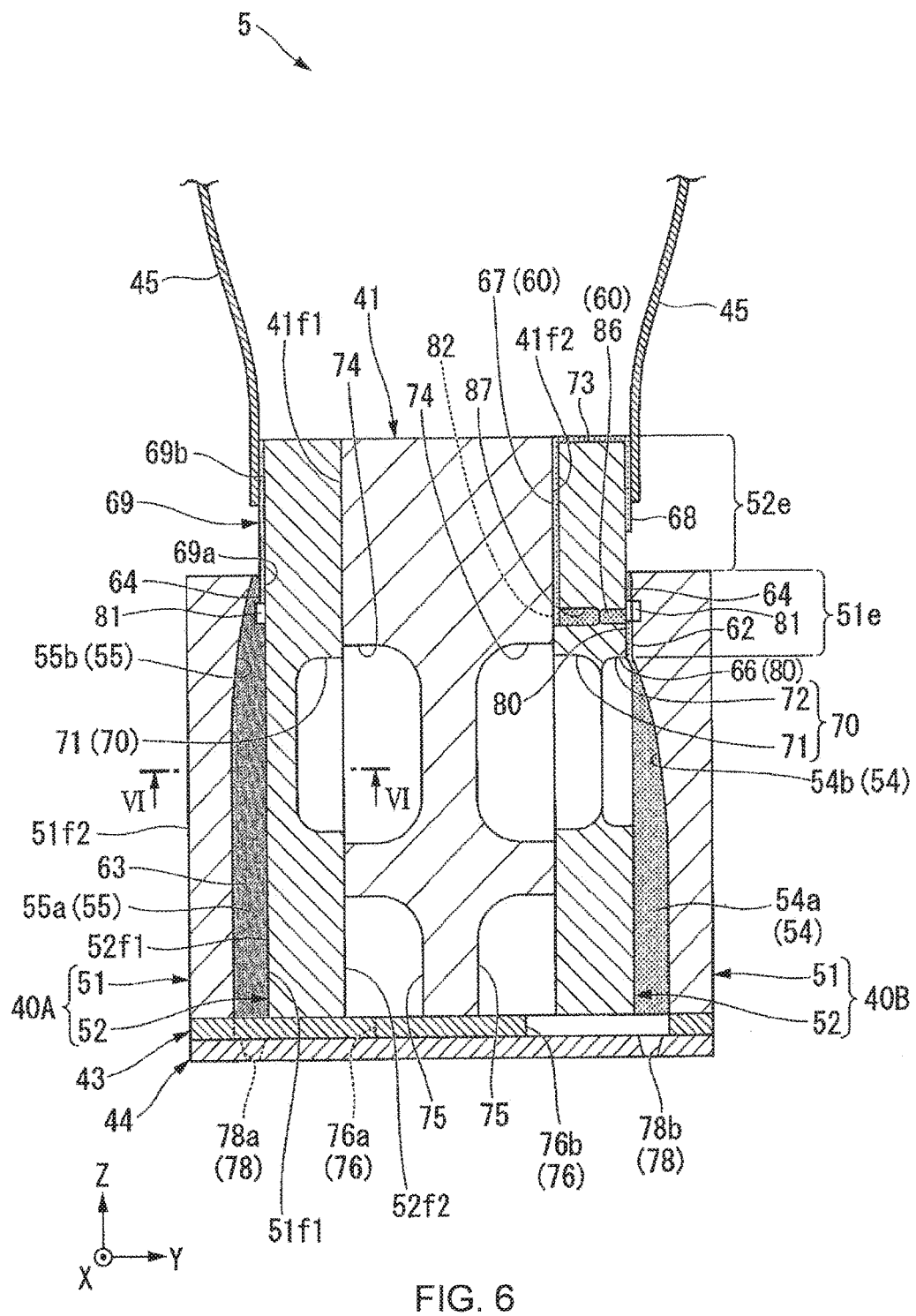
FIG. 6 is a sectional view illustrating the ink jet head in the embodiment.

FIG. 6 is a diagram illustrating a section of the non-discharge channel 55 in the first head chip 40A.

As illustrated in FIG. 6, the non-discharge channel 55 includes an extension portion 55a positioned at the lower end portion of the discharge channel 55, and a raise-and-cut portion 55b which continues upward from the extension portion 55a.

The extension portion 55a has a groove depth which is constant over the entirety thereof in the Z-direction. The length of the extension portion 55a in the non-discharge channel 55 in the Z-direction is longer than the length of the extension portion 54a (see FIG. 5) in the discharge channel 54 in the Z-direction. The raise-and-cut portion 55b has a groove depth which gradually becomes shallow while being raised upwardly. The slope of the raise-and-cut portion 55b in the non-discharge channel 55 is substantially the same as the slope of the raise-and-cut portion 54b (see FIG. 5) in the discharge channel 54. That is, in the discharge channel 54 and the non-discharge channel 55, a slope start position is different by a difference of the length in the Z-direction between the extension portions 54a and 55a, but the slope itself (gradient, curvature) is substantially the same as each other.

In the embodiment, plating is performed before the electrode clearance groove 81 is formed. Thus, in the plating step, when the catalyst is washed, it is possible to control the amount of a washing liquid flowing in the discharge channel 54 to be substantially equal to the amount of a washing liquid flowing in the non-discharge channel 55. Accordingly, it is possible to avoid forming a lump which acts as a cause of biasing the degree of washing, and to avoid, for example, an increase of the number of poor products obtained by an occurrence of a short circuit resulting from the lump.

The plurality of channels 54 and 55 have shapes which are different from each other. Specifically, the length of the non-discharge channel 55 in the Z-direction is longer than the length of the discharge channel 54 in the Z-direction. Here, the groove width of each of the channels 54 and 55 is set to be W and the groove depth thereof is set to be D. The groove width W means the length of each of the channels 54 and 55 in the X-direction. The groove depth D means the length of each of the channels 54 and 55 in the Y-direction. For example, regarding the extension portion 54a of the channel 54 and the extension portion 55a of the channel 55, the ratio D/W between the groove width W and the groove depth D is set to be equal to or greater than 3 (D/W≥3).

As illustrated in FIG. 5, a common electrode 61 is formed on an inner surface of the discharge channel 54. The common electrode 61 is formed on the entirety of the inner surface of the discharge channel 54. That is, the common electrode 61 is formed on the entirety of the inner surface of the extension portion 54a and on the entirety of the inner surface of the raise-and-cut portion 54b.

An actuator plate-side common pad 62 (referred to as "an AP-side common pad 62" below) is formed on an inner side surface of a portion 51e (portion from the end portion on the discharge channel 54 side in the Z-direction to the end portion on the actuator plate 51 side in the Z-direction, and being referred to as "an AP-side tail portion 51e" below) of the actuator plate 51, which is positioned over the discharge channel 54, in the Y-direction. The AP-side common pad 62 is formed to extend from an upper end of the common electrode 61 to an inner side surface of the AP-side tail portion 51e in the Y-direction. That is, the lower end portion of the AP-side common pad 62 is connected to the common electrode 61 in the discharge channel 54. The upper end portion of the AP-side common pad 62 is terminated on the inner side surface of the AP-side tail portion 51e in the Y-direction. The AP-side common pad 62 is connected to the common electrode 61. As illustrated in FIG. 4, a plurality of AP-side common pads 62 are disposed to be spaced from each other in the X-direction, on the inner side surface of the AP-side tail portion 51e (see FIG. 8) in the Y-direction.

As illustrated in FIG. 6, an individual electrode 63 is formed on an inner surface of the non-discharge channel 55.

Figure 7:
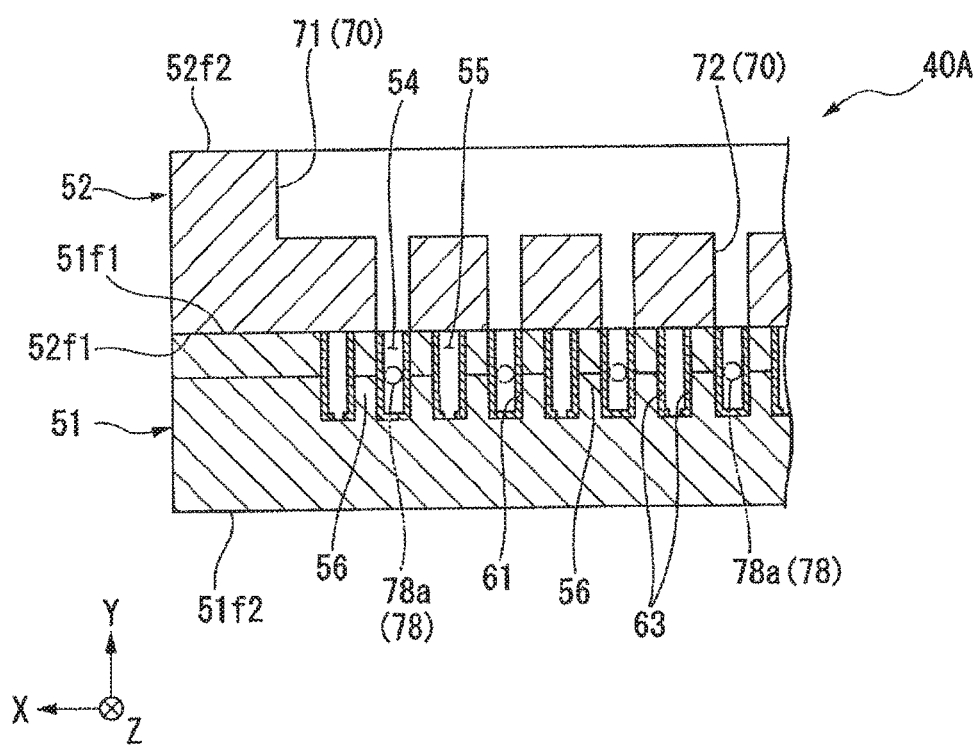
FIG. 7 is a view illustrating a section taken along VI-VI in FIG. 6.

As illustrated in FIG. 7, individual electrodes 63 are respectively formed on inner side surfaces which face each other in the X-direction, in the inner surface of the non-discharge channel 55. Thus, among individual electrodes 63, individual electrodes 63 which face each other in the same non-discharge channel 55 are electrically isolated on the bottom surface of the non-discharge channel 55. The individual electrode 63 is formed over the entirety (entirety in the Y-direction and the Z-direction) of the inner side surface of the non-discharge channel 55.

As illustrated in FIG. 6, an actuator plate-side individual wiring 64 (referred to as "an AP-side individual wiring 64" below) is formed on the inner side surface of the AP-side tail portion 51e in the Y-direction. As illustrated in FIG. 4, regarding the AP-side individual wiring 64, a portion of on the inner side surface of the AP-side tail portion 51e (see FIG. 8) in the Y-direction, which is positioned over the AP-side common pad 62 extends in the X-direction. The AP-side individual wiring 64 connects individual electrodes 63 which face each other with the discharge channel 54 interposed between the individual electrodes 63.

As illustrated in FIGS. 5, 6, and 8, the electrode clearance groove 81 for preventing the occurrence of a short circuit between the transverse common electrode 80 formed in the cover plate 52 and the AP-side individual wiring 64 is formed between the AP-side common pad 62 and the AP-side individual wiring 64 in the AP-side tail portion 51e.

Although details will be described later, in the actuator plate 51 in the embodiment, various electrodes are formed on the actuator wafer 110 in which the channel grooves (54 and 55) for the channels are previously formed, by plating. Then, the electrode clearance groove 81 is formed by cutting with a dicing blade.

Cover Plate

As illustrated in FIG. 4, the appearance of the cover plate 52 is a rectangular plate shape which is long in the X-direction and is short in the Z-direction. The length of the cover plate 52 in a longer side direction is substantially equal to the length of the actuator plate 51 in the longer side direction. The length of the cover plate 52 in a shorter side direction is longer than the length of the actuator plate 51 in the shorter side direction. A first main surface (cover plate-side first main surface) of the cover plate 52, which faces the AP-side-Y-direction inner side surface 51f1 is bonded to the AP-side-Y-direction inner side surface 51f1. In the embodiment, the cover plate-side first main surface refers to an outer side surface 52f1 of the cover plate 52 in the Y-direction (referred to as "a CP-side-Y-direction outer side surface 52f1" below). Here, the outer side in the Y-direction means an opposite side of the center side of the ink jet head 5 in the Y-direction (opposite side of the flow passage plate 41 side in the Y-direction). In the embodiment, a cover plate-side second main surface refers to an inner side surface 52f2 of the cover plate 52 in the Y-direction (referred to as "a CP-side-Y-direction inner side surface 52f2" below).

A liquid supply passage 70 is formed in the cover plate 52. The liquid supply passage 70 penetrates the cover plate 52 in the Y-direction (third direction) and communicates with the discharge channel 54. The liquid supply passage 70 includes a common ink room 71 and a plurality of slits 72. The common ink room 71 is formed in a manner that the inner side of the cover plate 52 is opened in the Y-direction. The plurality of slits 72 communicate with the common ink room 71. The slits 72 are opened in the outer side of the cover plate 52 in the Y-direction and are disposed to be spaced from each other in the X-direction. The common ink room 71 individually communicates with the discharge channels 54 through the slit 72, respectively. The common ink room 71 does not communicate with the non-discharge channel 55.

As illustrated in FIG. 5, the common ink room 71 is formed in the CP-side-Y-direction inner side surface 52f2. The common ink room 71 is disposed at a position which is substantially the same as that of the raise-and-cut portion 54b of the discharge channel 54, in the Z-direction. The common ink room 71 is formed to have a groove shape which is recessed toward the CP-side-Y-direction outer side surface 52f1 side and extends in the X-direction. An ink flows into the common ink room 71 through the flow passage plate 41.

The slits 72 are formed in the CP-side-Y-direction outer side surface 52f1. The slits 72 are disposed at positions which face the common ink room 71 in the Y-direction. The slit 72 communicates with the common ink room 71 and the discharge channel 54. The width of the slit 72 in the X-direction is substantially equal to the width of the discharge channel 54 in the X-direction.

A through-hole 87 is formed in the cover plate 52. The through-hole 87 penetrates the cover plate 52 in the Y-direction and is disposed at a place in which the flow passages for an ink (liquid) is not formed. The through-hole 87 is disposed at a position which avoids the liquid supply passage 70 in the cover plate 52. The through-hole 87 is disposed at a portion of the cover plate 52, which is positioned over the liquid supply passage 70.

The through-hole 87 has a slit shape (elliptical shape) which is long in the X-direction. For example, the length of the through-hole 87 in a longitudinal direction thereof is set to be substantially equal to the array pitch between two slits 72 which are adjacent to each other.

The length of the through-hole 87 and the number of through-holes 87 which are disposed may be appropriately changed.

In the embodiment, the through-hole 87 is formed to have a slit shape as illustrated in FIG. 8. However, the through-hole 87 may be formed to be a circular through-hole. FIG. 4 illustrates a case where a circular through-hole 85 is formed.

As illustrated in FIGS. 4 and 8, a plurality of through-holes 87(85) are disposed at an array pitch which is the substantially equal interval, to be spaced from each other in the X-direction.

Each of the through-holes 87 is disposed at substantially the same position in the X-direction, so as to correspond to each of two slits 72. Each of the through-holes 85 (FIG. 4) is disposed at a position which is substantially the same as the position of each of the slits 72 in the X-direction.

That is, each of the through-holes 87 (85), and the slit 72 are disposed to be lined up in the Z-direction.

In the cover plate 52, an in-through-hole electrode 86 is formed on the inner surface of the through-hole 87. For example, the in-through-hole electrode 86 is formed only on an inner circumferential surface of the through-hole 87 by vapor deposition or the like. The through-hole 87 may be filled with the in-through-hole electrode 86 by using a conductive paste or the like.

Since the through-hole 87 is formed to have a slit shape, it is easy to increase the region of forming the in-through-hole electrode 86, and to improve reliability of electrical connection between the in-through-hole electrode 86 and the transverse common electrode 80, in comparison to a case where the circular through-hole 85 is formed. In addition, it is sufficient that the through-hole 87 is extended only in the extension direction (X-direction) of the transverse common electrode 80. Thus, it is possible to reduce the length of each of the head chips 40A and 40B in the Z-direction.

As illustrated in FIG. 8, a cover plate-side common pad 66 (referred to as "a CP-side common pad 66" below) is formed around the through-hole 87 in the CP-side-Y-direction outer side surface 52/1. As illustrated in FIG. 5, the CP-side common pad 66 is formed to extend downward from the in-through-hole electrode 86 toward the CP-side-Y-direction outer side surface 52/1. That is, the upper end portion of the CP-side common pad 66 is connected to the in-through-hole electrode 86 in the through-hole 87. The lower end portion of the CP-side common pad 66 is terminated between the through-hole 87 and the slit 72 in the Z-direction, on the CP-side-Y-direction outer side surface 52/1. The CP-side common pad 66 continues to the in-through-hole electrode 86. The CP-side common pad 66 is separated upwardly from the upper end of the slit 72. A plurality of CP-side common pads 66 are disposed to be spaced from each other on the CP-side-Y-direction outer side surface 52/1 in the X-direction (see FIG. 8).

The CP-side common pad 66 faces the AP-side common pad 62 in the Y-direction. As illustrated in FIG. 8, the CP-side common pad 66 is disposed at a position corresponding to the AP-side common pad 62 when the actuator plate 51 and the cover plate 52 are bonded to each other. That is, when the actuator plate 51 and the cover plate 52 are bonded to each other, the CP-side common pad 66 and the AP-side common pad 62 are electrically connected to each other.

As illustrated in FIG. 8, the transverse common electrode 80 which is connected to the plurality of CP-side common pads 66 may be formed on the CP-side-Y-direction outer side surface 52/1. In the transverse common electrode 80, a portion of the CP-side-Y-direction outer side surface 52/1, which is positioned between the slit 72 and the CP-side individual pad 69a extends in the X-direction. The transverse common electrode 80 is formed to have a band shape in the X-direction, on the CP-side-Y-direction outer side surface 52/1. The transverse common electrode 80 is connected to upper end portions of the plurality of CP-side common pads 66, on the CP-side-Y-direction outer side surface 52/1. The transverse common electrode 80 does not abut on the CP-side individual pad 69a, on the CP-side-Y-direction outer side surface 52/1.

The electrode clearance groove 81 of the transverse common electrode 80 is formed in the inner side surface of the AP-side tail portion 51e in the Y-direction. In the electrode clearance groove 81, a portion of the inner side surface of the AP-side tail portion 51e in the Y-direction, which is positioned between the AP-side common pad 62 and the AP-side individual wiring 64 extends in the X-direction. The electrode clearance groove 81 faces the transverse common electrode 80 in the Y-direction. The electrode clearance groove 81 is disposed at a position corresponding to that of the transverse common electrode 80 when the actuator plate 51 and the cover plate 52 are bonded to each other. That is, when the actuator plate 51 and the cover plate 52 are bonded to each other, the transverse common electrode 80 is disposed in the electrode clearance groove 81.

The transverse common electrode 80 which is connected to the plurality of CP-side common pads 66 and extends in the X-direction is formed on the CP-side-Y-direction outer side surface 52/1. Since it is possible to preliminarily connect the plurality of CP-side common pads 66 by the transverse common electrode 80, it is possible to improve reliability for electrical connection of the plurality of CP-side common pads 66, in comparison to a case where the plurality of CP-side common pads 66 are connected to only the in-through-hole electrodes 86.

The electrode clearance groove 81 which extends in the X-direction and faces the transverse common electrode 80 in the Y-direction is formed in the inner side surface of the AP-side tail portion 51e in the Y-direction. When the actuator plate 51 and the cover plate 52 are bonded to each other, the transverse common electrode 80 can be accommodated by the electrode clearance groove 81. Thus, it is possible to avoid an occurrence of short circuit between the electrode on the actuator plate 51 side (for example, AP-side individual wiring 64), and the transverse common electrode 80.

As illustrated in FIGS. 5 and 8, a common lead wiring (lead wiring) 67 is formed around the through-hole 87 in the CP-side-Y-direction inner side surface 52/2. As illustrated in FIG. 4, a plurality of recess portions 73 are formed at the upper end of the cover plate 52. The recess portions 73 are recessed to the inner side of the cover plate 52 in the Z-direction, and are disposed to be spaced from each other in the X-direction. FIG. 4 illustrates four recess portions 73 which are arranged at a substantially equal interval in the X-direction.

As illustrated in FIG. 5, the common lead wiring 67 extends upwardly on the CP-side-Y-direction inner side surface 52/2 from the through-hole 87 along the CP-side-Y-direction inner side surface 52/2. Then, the common lead wiring 67 is drawn up to the upper end portion of the CP-side-Y-direction outer side surface 52/1 along the recess portion 73 at the upper end of the cover plate 52. In other words, the common lead wiring 67 is drawn up to the outer side surface of a portion 52e (referred to as "a CP-side tail portion 52e" below) of the cover plate 52, which is positioned over the actuator plate 51, in the Y-direction. Thus, the common electrode 61 formed on the inner surface of each of the plurality of discharge channels 54 is electrically connected to a flexible substrate (external wiring) 45 in the common terminal 68, through the AP-side common pad 62, the CP-side common pad 66, the in-through-hole electrode 86, and the common lead wiring 67. In the embodiment, the common lead wiring 67 and the in-through-hole electrode 86 constitute a connection wiring 60 which connects the common electrode 61 and the flexible substrate 45 to each other. In the connection wiring 60, the common lead wiring 67 is formed to be divided into a plurality of parts of which the number is at least 3 or greater in the cover plate 52 in the X-direction.

Figure 9:
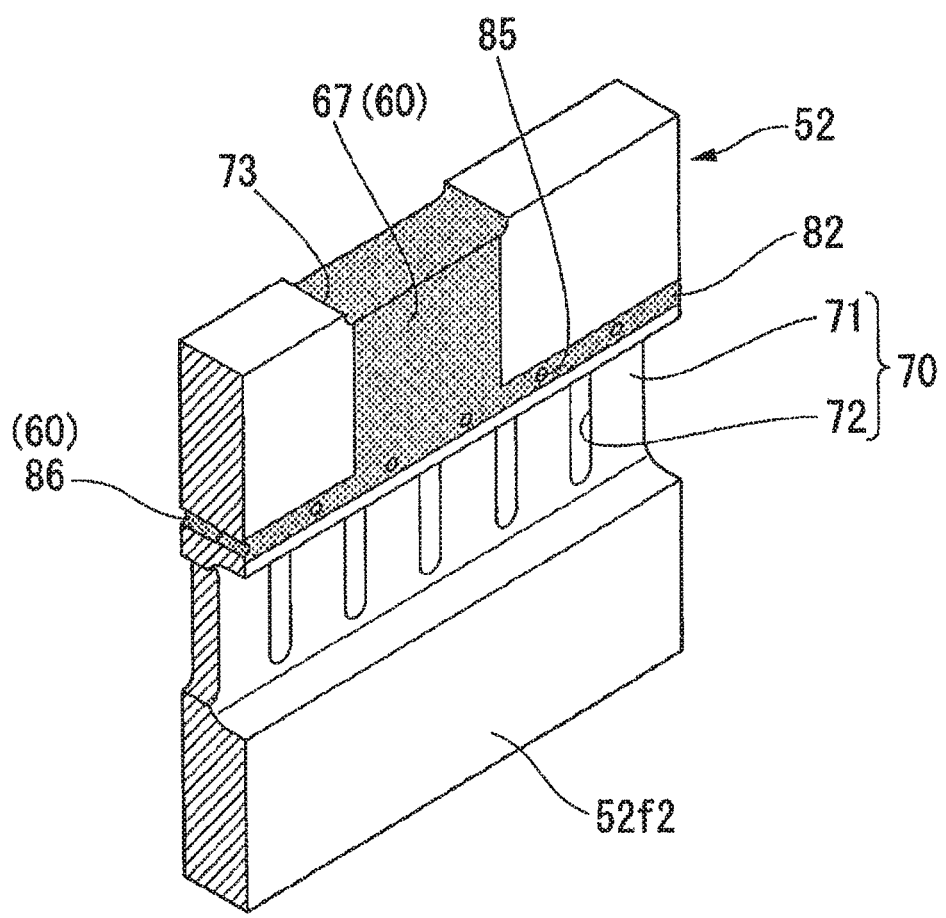
FIG. 9 is a perspective view illustrating a cover plate in the embodiment.

FIG. 9 is a perspective view when the cover plate 52 illustrated in FIG. 8 is viewed from the opposite side (CP-side-Y-direction inner side surface 52/2 side) thereof.

As illustrated in FIG. 9, a joint common electrode 82 which is connected to a plurality of common lead wirings 67 is formed on the CP-side-Y-direction inner side surface 52/2. As illustrated in FIG. 4, the joint common electrode 82 is formed in a manner that a portion of the CP-side-Y-direction inner side surface 52/2 between two common lead wiring 67 which are adjacent to each other extends in the X-direction. The joint common electrode 82 is formed to have a band shape in an arrangement direction (X-direction) of the plurality of through-holes 87, on the CP-side-Y-direction inner side surface 52/2. The joint common electrode 82 is connected to lower end portions of the plurality of common lead wirings 67, on the CP-side-Y-direction inner side surface 52/2. The joint common electrode 82 is separated upwardly from the upper end of the common ink room 71, on the CP-side-Y-direction inner side surface 52/2.

As illustrated in FIG. 8, the common lead wiring 67 includes common terminals 68 which are formed to be divided into a plurality of parts of which the number is at least 3 or greater in the X-direction, on the outer side surface of the CP-side tail portion 52e in the Y-direction. In the embodiment, 4 common terminals 68 are arranged to be spaced from each other in the X-direction, on the outer side surface of the CP-side tail portion 52e in the Y-direction. The distance between two common terminals 68 which are adjacent to each other is substantially equal.

A cover plate-side individual wiring 69 (referred to as "a CP-side individual wiring 69" below) is formed in the cover plate 52. The CP-side individual wiring 69 is formed to be divided in the X-direction, at the upper end portion of the CP-side-Y-direction outer side surface 52/1. The CP-side individual wiring 69 includes a cover plate-side individual pad 69a (referred to as "a CP-side individual pad 69a" below) and an individual terminal 69b. The CP-side individual pad 69a is disposed at a position corresponding to the AP-side individual wiring 64 when the actuator plate 51 and the cover plate 52 are bonded to each other. The individual terminal 69b is formed in a manner that the individual terminal 69b is inclined to be positioned outwardly in the X-direction as coming to the upper side from the CP-side individual pad 69a, and then the individual terminal 69b extends to have a straight-line shape.

That is, when the actuator plate 51 and the cover plate 52 are bonded to each other, the CP-side individual pad 69a and the AP-side individual wiring 64 are electrically connected to each other. A plurality of CP-side individual pads 69a are arranged at a distance in the X-direction. The distance (array pitch) between two CP-side individual pads 69a which are adjacent to each other is substantially constant. The plurality of CP-side individual pads 69a and a plurality of CP-side common pads 66 face each other one by one in the Z-direction. In other words, each of the CP-side individual pads 69a and each of the CP-side common pads 66 are disposed to be aligned on a straight line in the Z-direction.

The individual terminal 69b extends to the upper end of the CP-side tail portion 52e on the outer side surface thereof in the Y-direction. Thus, the individual electrode 63 formed in the inner surface of each of the non-discharge channels 55 is electrically connected to the flexible substrate 45 (see FIG. 6) on the individual terminal 69b, through the AP-side individual wiring 64 and the CP-side individual pad 69a.

A plurality of individual terminals 69b are arranged to be spaced from each other in the X-direction. The distance (array pitch) between two individual terminals 69b which are adjacent to each other is substantially constant. The plurality of individual terminals 69b are arranged between the plurality of common terminals 68 (common terminal groups) which are arranged in the X-direction. The array pitch between the individual terminals 69b and the array pitch between the common terminals 68 are substantially equal to each other.

The cover plate 52 is formed of a material which has insulating properties, and has thermal conductivity which is equal to or greater than that of the actuator plate 51. For example, in a case where the actuator plate 51 is formed of PZT, the cover plate 52 is preferably formed of PZT or silicon. Thus, it is possible to reduce temperature variation in the actuator plate 51 and to cause the temperature of an ink to be uniform. Thus, it is possible to cause a discharge speed of an ink to be uniform and to improve printing stability.

Arrangement Relationship of Pair of Head Chips

As illustrated in FIG. 4, the head chips 40A and 40B are arranged to be spaced from each other in the Y-direction, in a state where CP-side-Y-direction inner side surfaces 52/2 face each other in the Y-direction.

The discharge channel 54 and the non-discharge channel 55 of the second head chip 40B are arranged so as to be shifted in the X-direction by the half pitch of the array pitch between the discharge channel 54 and the non-discharge channel 55 of the first head chip 40A. That is, the discharge channels 54 of the head chips 40A and 40B are arranged in zigzags, and the non-discharge channel 55 of the head chips 40A and 40B are arranged in zigzags.

That is, as illustrated in FIG. 5, the discharge channel 54 of the first head chip 40A faces the non-discharge channel 55 of the second head chip 40B in the Y-direction. As illustrated in FIG. 4, the non-discharge channel 55 of the first head chip 40A faces the discharge channel 54 of the second head chip 40B in the Y-direction. The pitch between the channels 54 and 55 in each of the head chips 40A and 40B may be appropriately changed.

Flow Passage Plate

The flow passage plate 41 is sandwiched between the first head chip 40A and the second head chip 40B in the Y-direction. The flow passage plate 41 is integrally formed of the same member. As illustrated in FIG. 4, the appearance of the flow passage plate 41 is a rectangular plate shape which is long in the X-direction and is short in the Z-direction. When viewed from the Y-direction, the appearance of the flow passage plate 41 is substantially the same as the appearance of the cover plate 52.

The CP-side-Y-direction inner side surface 52/2 in the first head chip 40A is bonded to a first main surface 41/1 (surface directed toward the first head chip 40A side) of the flow passage plate 41 in the Y-direction. The CP-side-Y-direction inner side surface 52/2 in the second head chip 40B is bonded to a second main surface 41/2 (surface directed toward the second head chip 40B side) of the flow passage plate 41 in the Y-direction.

The flow passage plate 41 is formed of a material which has insulating properties, and has thermal conductivity which is equal to or greater than that of the cover plate 52. For example, in a case where the cover plate 52 is formed of silicon, the flow passage plate 41 is preferably formed of silicon or carbon. Thus, it is possible to reduce temperature variation in the cover plate 52 between the head chips 40A and 40B. Therefore, it is possible to reduce temperature variation in the actuator plate 51 between the head chips 40A and 40B and to cause the temperature of an ink to be uniform. Thus, it is possible to cause a discharge speed of an ink to be uniform and to improve printing stability.

An inlet flow passage 74 and an outlet flow passage 75 are formed in each of the main surfaces 41/1 and 41/2 of the flow passage plate 41. The inlet flow passage 74 individually communicates with the common ink room 71. The outlet flow passage 75 individually communicates with the circulation passage 76 of the return plate 43.

The inlet flow passage 74 is recessed from each of the main surfaces 41/1 and 41/2 of the flow passage plate 41 toward the inner side thereof in the Y-direction. One end portion of the inlet flow passage 74 in the X-direction is opened in one end surface of the flow passage plate 41 in the X-direction. The inlet flow passage 74 is inclined to be positioned downwardly, as coming to the other end side thereof in the X-direction from one end surface of the flow passage plate 41 in the X-direction. Then, the inlet flow passage 74 is bent toward the other end side thereof in the X-direction, and extends to have a straight-line shape. As illustrated in FIG. 5, the width of the inlet flow passage 74 in the Z-direction is greater than the width of the common ink room 71 in the Z-direction. The width of the inlet flow passage 74 in the Z-direction may be equal to or smaller than the width of the common ink room 71 in the Z-direction.

The inlet flow passages 74 are arranged between the first head chip 40A and the second head chip 40B in the Y-direction, so as to be spaced from each other in the Y-direction. That is, in the flow passage plate 41, a portion between the inlet flow passages 74 in the Y-direction is partitioned by a wall member. Thus, pressure fluctuation in the channel, which occurs when an ink is discharged is blocked by the wall member. Accordingly, it is possible to suppress the occurrence of so-called crosstalk in which the pressure fluctuation propagates as a pressure wave, to another channel and the like through the flow passage between the head chips 40A and 40B. Thus, it is possible to obtain excellent discharge performance (printing stability).

As illustrated in FIG. 4, the outlet flow passage 75 is recessed from each of the main surfaces 41/1 and 41/2 of the flow passage plate 41 toward the inner side thereof in the Y-direction, and is recessed upwardly from the lower end surface of the flow passage plate 41. One end portion of the outlet flow passage 75 is opened in the other end surface of the flow passage plate 41 in the X-direction. The outlet flow passage 75 is bent downward from the other end surface of the flow passage plate 41 in the X-direction, so as to have a crank shape. Then, the outlet flow passage 75 extends toward the one end side thereof in the X-direction, so as to have a straight-line shape. As illustrated in FIG. 5, the width of the outlet flow passage 75 in the Z-direction is smaller than the width of the inlet flow passage 74 in the Z-direction. The depth of the outlet flow passage 75 in the Y-direction is substantially equal to the depth of the inlet flow passage 74 in the Y-direction.

The outlet flow passage 75 is connected to the outlet manifold (not illustrated) on the other end surface of the flow passage plate 41 in the X-direction. The outlet manifold is connected to the ink discharge tube 22 (see FIG. 2).

Outlet flow passages 75 are arranged between the first head chip 40A and the second head chip 40B in the Y-direction, so as to be spaced from each other in the Y-direction. That is, in the flow passage plate 41, a portion between the outlet flow passages 75 in the Y-direction is partitioned by a wall member. Thus, pressure fluctuation in the channel, which occurs when an ink is discharged is blocked by the wall member. Accordingly, it is possible to suppress the occurrence of so-called crosstalk in which the pressure fluctuation propagates as a pressure wave, to another channel and the like through the flow passage between the head chips 40A and 40B. Thus, it is possible to obtain excellent discharge performance (printing stability).

When the section in FIG. 5 is viewed, the inlet flow passage 74 and the outlet flow passage 75 are not formed at a portion of the flow passage plate 41, which overlaps the CP-side tail portion 52e in the Y-direction. That is, the portion of the flow passage plate 41, which overlaps the CP-side tail portion 52e in the Y-direction is set to be the solid member. Thus, in comparison to a case the portion of the flow passage plate 41, which overlaps the CP-side tail portion 52e in the Y-direction is set to be a hollow member, it is possible to avoid poor crimping occurring by a space between members at a time of connection, when the flow passage plate 41 and the cover plate 52 are connected to each other.

Inlet Manifold

As illustrated in FIG. 4, the inlet manifold 42 is collectively bonded to one end surface of the head chips 40A and 40B and the flow passage plate 41 in the X-direction. A supply passage 77 which communicates with each of inlet flow passages 74 is formed in the inlet manifold 42. The supply passage 77 is recessed from the inner end surface of the inlet manifold 42 in the X-direction toward the outside thereof in the X-direction. The supply passage 77 collectively communicates with the inlet flow passages 74. The inlet manifold 42 is connected to the ink supply tube 21 (see FIG. 2).

Return Plate

The appearance of the return plate 43 is a rectangular plate shape which is long in the X-direction and is short in the Y-direction. The return plate 43 is collectively bonded to lower end surfaces of the head chips 40A and 40B and the flow passage plate 41. In other words, the return plate 43 is disposed on the opening end side of the discharge channels 54 in the first head chip 40A and the second head chip 40B. The return plate 43 is a spacer plate which is interposed between the opening ends of the discharge channels 54 in the first head chip 40A and the second head chip 40B, and the upper end of the nozzle plate 44. A plurality of circulation passages 76 that respectively connect the discharge channels 54 in the head chips 40A and 40B to the outlet flow passage 75 are formed in the return plate 43. The plurality of circulation passages 76 include first circulation passages 76a and second circulation passages 76b. The plurality of circulation passages 76 penetrate the return plate 43 in the Z-direction.

As illustrated in FIG. 5, the first circulation passages 76a are formed at positions which are substantially the same as those of the discharge channels 54 of the first head chip 40A in the X-direction, respectively. A plurality of first circulation passages 76a are formed to be spaced from each other in the X-direction, corresponding to the array pitch between the discharge channels 54 in the first head chip 40A.

The first circulation passage 76a extends in the Y-direction. The inner side end portion of the first circulation passage 76a in the Y-direction is positioned on an inner side from the CP-side-Y-direction inner side surface 52/2 of the first head chip 40A in the Y-direction. The inner side end portion of the first circulation passage 76a in the Y-direction communicates with the inside of the outlet flow passage 75. The outer side end portion of the first circulation passage 76a in the Y-direction individually communicates with the inside of the corresponding discharge channel 54 in the first head chip 40A.

The cross-sectional area obtained when a portion of the discharge channel 54 in the first head chip 40A, which faces the return plate 43 is cut out at a plane which is orthogonal to the flowing direction of an ink is referred to as "a channel-side flow passage cross-sectional area" below. Here, the portion of the discharge channel 54 in the first head chip 40A, which faces the return plate 43 means a portion (boundary portion) at which the discharge channel 54 and the first circulation passage 76a are in contact with each other. That is, the channel-side flow passage cross-sectional area means an opening area of a downstream side end of the discharge channel 54 of the first head chip 40A in the flowing direction of an ink.

The cross-sectional area obtained when the first circulation passage 76a is cut out at a plane which is orthogonal to the flowing direction of an ink is referred to as "a circulation passage-side flow passage cross-sectional area" below. That is, the circulation passage-side flow passage cross-sectional area means a cross-sectional area when the first circulation passage 76 is cut out at a plane which is orthogonal to an extension direction of the first circulation passage 76.

In the embodiment, the circulation passage-side flow passage cross-sectional area is smaller than the channel-side flow passage cross-sectional area. Thus, in comparison to a case where the circulation passage-side flow passage cross-sectional area is greater than the channel-side flow passage cross-sectional area, it is possible to suppress the occurrence of so-called crosstalk in which pressure fluctuation in the channel, which occurs, for example, when an ink is discharged propagates as a pressure wave, to another channel and the like through the flow passage. Thus, it is possible to obtain excellent discharge performance (printing stability).

As illustrated in FIG. 6, the second circulation passages 76b are formed at positions which are substantially the same as those of the discharge channels 54 of the second head chip 40B in the X-direction, respectively. A plurality of second circulation passages 76b are formed to be spaced from each other in the X-direction, corresponding to the array pitch between the discharge channels 54 in the second head chip 40B.

The second circulation passage 76b extends in the Y-direction. The inner side end portion of the second circulation passage 76b in the Y-direction is positioned on an inner side from the CP-side-Y-direction inner side surface 52f2 of the second head chip 40B in the Y-direction. The inner side end portion of the second circulation passage 76b in the Y-direction communicates with the inside of the outlet flow passage 75. The outer side end portion of the second circulation passage 76b in the Y-direction individually communicates with the inside of the corresponding discharge channel 54 in the second head chip 40B.

Nozzle Plate

As illustrated in FIG. 4, the appearance of the nozzle plate 44 is a rectangular plate shape which is long in the X-direction and is short in the Y-direction. The appearance of the nozzle plate 44 is substantially the same as the appearance of the return plate 43. The nozzle plate 44 is bonded to the lower end surface of the return plate 43. A plurality of nozzle holes (ejection holes) 78 which penetrate the nozzle plate 44 in the Z-direction are arranged in the nozzle plate 44. The plurality of nozzle holes 78 include first nozzle holes 78a and second nozzle holes 78b. The plurality of nozzle holes 78 penetrate the nozzle plate 44 in the Z-direction.

As illustrated in FIG. 5, the first nozzle holes 78a are formed at portions of the nozzle plate 44, which face the first circulation passages 76a of the return plate 43 in the Z-direction, respectively. That is, the first nozzle holes 78a are arranged on a straight line, so as to be spaced from each other in the X-direction and to have a pitch which is the same as that of the first circulation passages 76a. The first nozzle hole 78a communicates with the inside of the first circulation passage 76a at the outer end portion of the first circulation passage 76a in the Y-direction. Thus, the first nozzle hole 78a communicates with the corresponding discharge channel 54 of the first head chip 40A through the corresponding first circulation passage 76a.

As illustrated in FIG. 6, the second nozzle holes 78b are formed at portions of the nozzle plate 44, which face the second circulation passages 76b of the return plate 43 in the Z-direction, respectively. That is, the second nozzle holes 78b are arranged on a straight line, so as to be spaced from each other in the X-direction and to have a pitch which is the same as that of the second circulation passages 76b. The second nozzle hole 78b communicates with the inside of the second circulation passage 76b at the outer end portion of the second circulation passage 76b in the Y-direction. Thus, the second nozzle hole 78b communicates with the corresponding discharge channel 54 of the second head chip 40B through the corresponding second circulation passage 76b.

Meanwhile, the non-discharge channel 55 does not communicate with the nozzle holes 78a and 78b, and is covered from a lower part by the return plate 43.

Operation Method of Printer

Next, an operation method of the printer 1 in a case where letters, figures, or the like are recorded on a recording medium P by using the printer 1 will be described.

A state where the four ink tanks 4 illustrated in FIG. 2 which respectively have sufficient inks of different colors are sealed is assumed as an initial state. A state where the ink jet head 5 is filled with the inks in the ink tanks 4 through the ink circulation means 6 is assumed.

As illustrated in FIG. 2, if the printer 1 in the initial state is operated, the grit rollers 11 and 13 of the transporting means 2 and 3 rotate so as to transport a recording medium P in a transport direction (X-direction) between the grit rollers 11 and 13, and the pinch rollers 12 and 14. Simultaneous with transporting of the recording medium P, the driving motor 38 rotates the pulleys 35 and 36 so as to operate the endless belt 37. Thus, the carriage 33 moves with reciprocating, in the Y-direction while being guided by the guide rails 31 and 32.

Since the inks of four colors are appropriately discharged to the recording medium P by the ink jet heads 5 during a period when the carriage 33 moves with reciprocating, letters, an image, or the like can be recorded on a recording medium P.

Here, motion of each of the ink jet heads 5 will be described.

In a vertical circulation type ink jet head 5 in the edge shoot type as in the embodiment, firstly, the pressure pump 24 and the suction pump 25 illustrated in FIG. 3 are operated, and thus an ink is caused to flow in the circulation flow passage 23. In this case, the ink flowing in the ink supply tube 21 flows into each of the inlet flow passages 74 of the flow passage plate 41, through the supply passage 77 of the inlet manifold 42 illustrated in FIG. 4. The ink flowing into each of the inlet flow passages 74 passes through the common ink room 71. Then, the ink is supplied into the discharge channels 54 through the slits 72, respectively. The inks flowing into the discharge channels 54 are collected in the outlet flow passage 75 through the circulation passage 76 of the return plate 43. Then, the ink is discharged to the ink discharge tube 22 illustrated in FIG. 3, through the outlet manifold (not illustrated). The ink discharged to the ink discharge tube 22 is brought back to the ink tank 4. Then, the ink is supplied to the ink supply tube 21 again. Thus, the ink is circulated between the ink jet head 5 and the ink tank 4.

If moving with reciprocating is started by the carriage 33 (see FIG. 2), a driving voltage is applied to the electrodes 61 and 63 via the flexible substrate 45. At this time, the driving voltage is applied between the electrodes 61 and 63, in a state where the individual electrode 63 is set to have a driving potential Vdd and the common electrode 61 is set to have a reference potential GND. If the voltage is applied, thickness shear deformation occurs in two drive walls 56 that define the discharge channel 54. Thus, the two drive walls 56 are deformed to protrude toward the non-discharge channel 55 side. That is, since two piezoelectric substrates which are polarized in the thickness direction (Y-direction) are stacked, if the driving voltage is applied, the actuator plate 51 in the embodiment is deformed and bent to have a V-shape by using the intermediate position of the drive wall 56 in the Y-direction, as the center. Thus, the discharge channel 54 deforms as it expands, for example.

If the volume of the discharge channel 54 is increased by the deformation of the two drive walls 56, an ink in the common ink room 71 is guided into the discharge channel 54 through the corresponding slits 72. The ink guided into the discharge channel 54 propagates in the discharge channel 54 in a form of a pressure wave. The driving voltage applied between the electrodes 61 and 63 reaches the zero at a timing when the pressure wave reaches the nozzle hole 78.

Thus, the drive wall 56 is restored, and the volume of the discharge channel 54, which has been temporarily increased returns to the original volume. With this operation, pressure in the discharge channel 54 is increased, and thus the ink is pressurized. As a result, it is possible to discharge the ink from the nozzle hole 78. At this time, when the ink passes through the nozzle hole 78, the ink is discharged in a form of an ink droplet having a droplet shape. Thus, as described above, letters, an image, or the like can be recorded on the recording medium P.

The operation method of the ink jet head 5 is not limited to the above-described details. For example, a configuration in which the drive wall 56 in a normal state is deformed to the inner side of the discharge channel 54, and thus the discharge channel 54 is, for example, recessed toward the inner side thereof may be made. In this case, this configuration may be realized by setting the voltage applied between the electrodes 61 and 63 to a voltage reversed to the above-described voltage, or by setting the polarization direction of the actuator plate 51 to be reversed without changing the applied direction of the voltage. In addition, a pressurized force of an ink when being discharged may increase in a manner that the discharge channel 54 is deformed bulging outwardly, and then deforms recessed to the inner side.

Manufacturing Method of Ink Jet Head

Figure 10A:
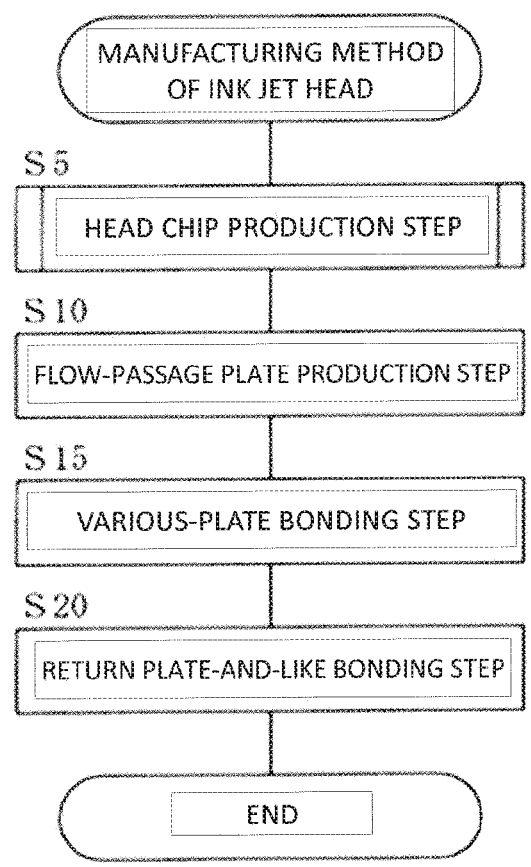
FIGS. 10A to 10C are flowcharts illustrating a manufacturing method of an ink jet head according to the embodiment.

Next, a manufacturing method of the ink jet head 5 will be described. The manufacturing method of the ink jet head 5 in the embodiment includes a head chip production step (Step 5), a flow-passage plate production step (Step 10), a various-plate bonding step (Step 15), and a return plate-and-like bonding step (Step 20), as illustrated in the flowchart of FIG. 10A.

The head chip production step may be performed for the head chips 40A and 40B, by using the similar method. Thus, in the following descriptions, the head chip production step for the first head chip 40A will be described.

Head Chip Production Step (Step 5)

Figure 10B:
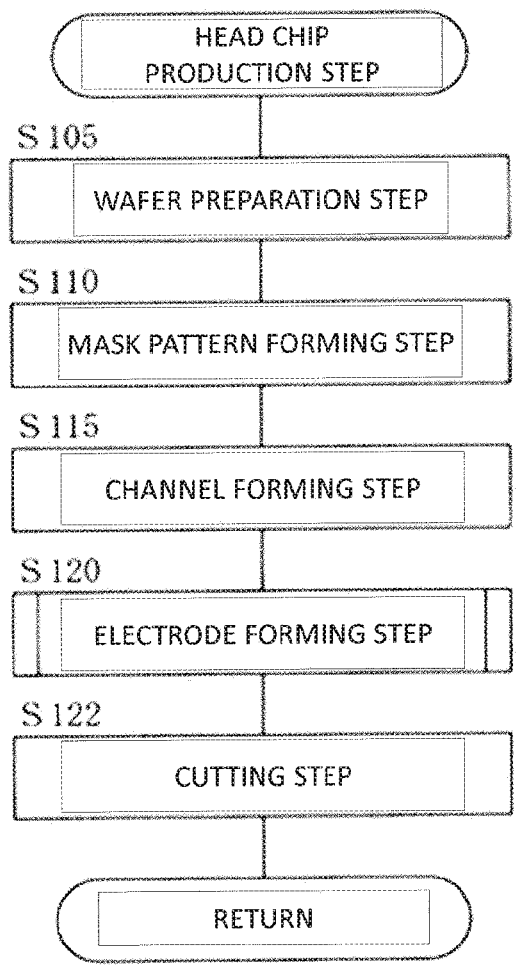

As steps for the actuator plate, the head chip production step in the embodiment includes a wafer preparation step (Step 105), a mask pattern forming step (Step 110), a channel forming step (Step 115), an electrode forming step (Step 120), and a cutting step (Step 122), as illustrated in FIG. 10B.

Figure 11:
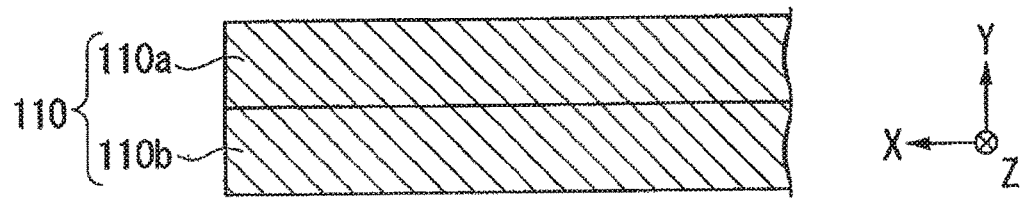
FIG. 11 is a step chart illustrating a wafer preparation step in the embodiment.

As illustrated in FIG. 11, in the wafer preparation step (Step 105), firstly, two piezoelectric wafers 110a and 110b which are polarized in a thickness direction (Y-direction) are stacked in a state where a polarization direction is set to be a reverse direction. Thus, a Chevron type actuator wafer 110 is formed.

Then, the front surface (one piezoelectric wafer 110a) of the actuator wafer 110 is ground. In the embodiment, a case where the piezoelectric wafers 110a and 110b having the same thickness are stuck to each other is described. However, piezoelectric wafers 110a and 110b having a thickness different from each other may be stuck to each other in advance.

Figure 12:
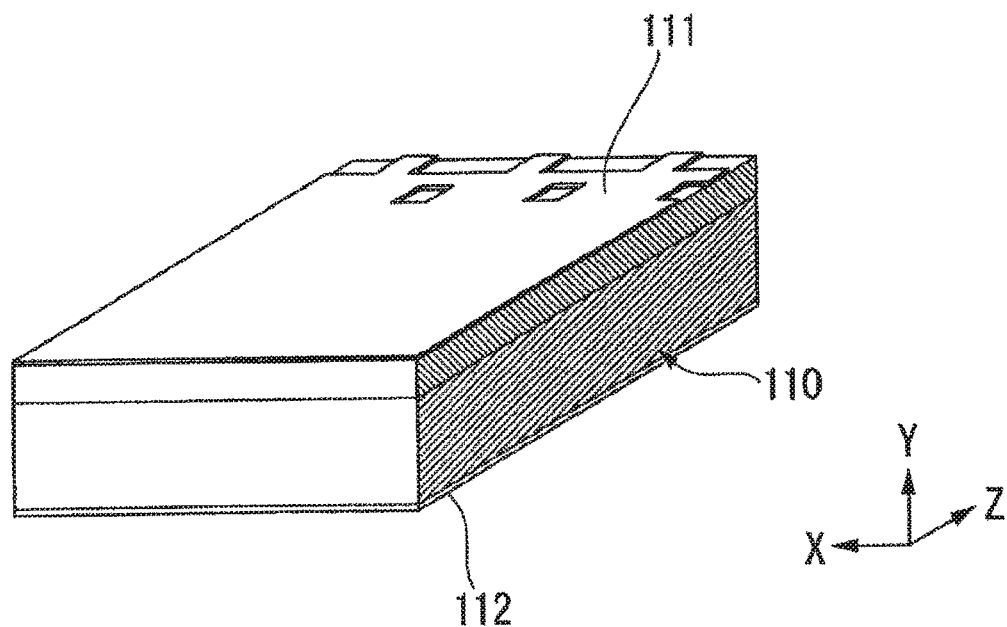
FIG. 12 is a step chart illustrating a mask pattern forming step in the embodiment.

As illustrated in FIG. 12, in the mask pattern forming step (Step 110), a mask pattern 111 used in the electrode forming step (Step 120) is formed. Specifically, a mounting tape 112 is put on the back surface of the actuator wafer 110. Then, a mask material such as a photosensitive dry film is put on the front surface of the actuator wafer 110. Then, patterning is performed on the mask material by using a photolithography technology, and thus a partial mask material of the mask material, which is positioned in a region for forming the AP-side common pad 62 and the AP-side individual wiring 64 (see FIG. 8) which are described above is removed. Thus, the mask pattern 111 in which at least the region for forming the AP-side common pad 62 and the AP-side individual wiring 64 is opened is formed on the front surface of the actuator wafer 110. In this case, the mask pattern 111 covers a portion of the actuator wafer 110, except for the region for forming the AP-side common pad 62 and the AP-side individual wiring 64. The mask material may be formed, for example, by coating the front surface of the actuator wafer 110.

Figure 13:
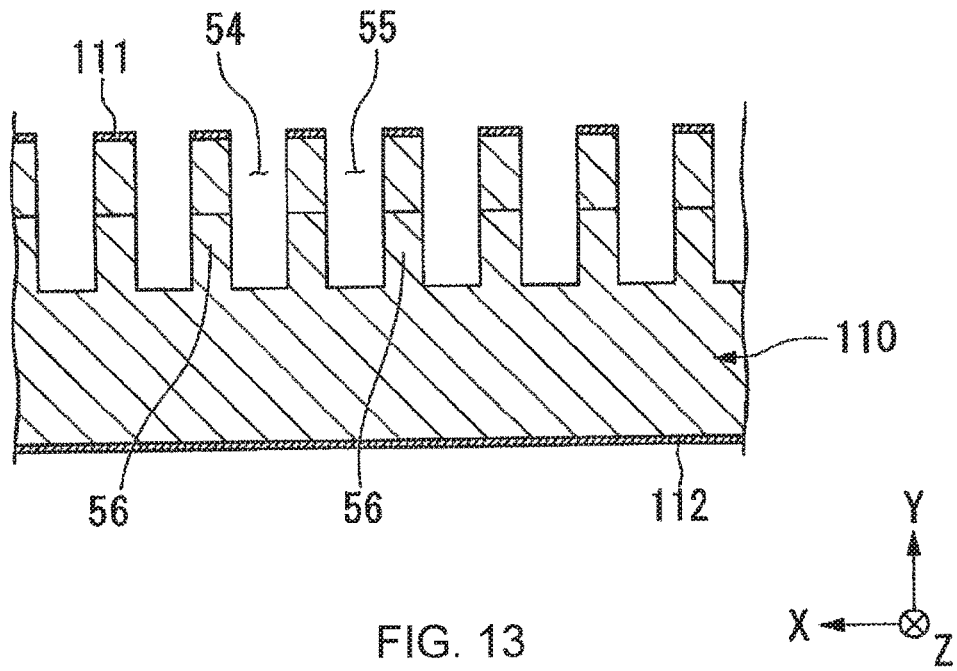
FIG. 13 is a step chart illustrating a channel forming step in the embodiment.
Figure 14:
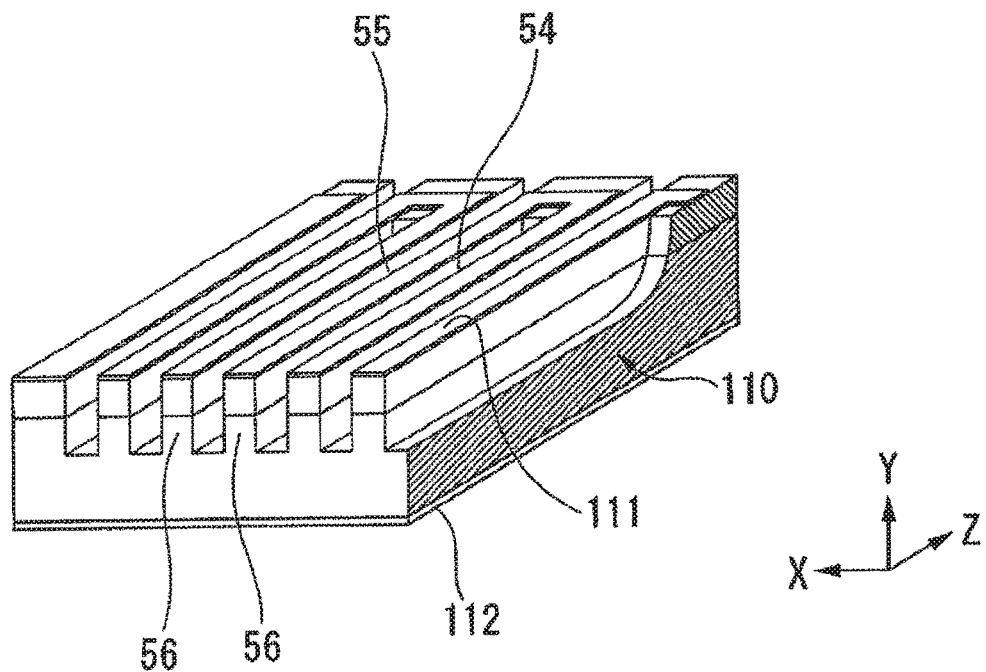
FIG. 14 is another step chart illustrating the channel forming step in the embodiment.

As illustrated in FIG. 13, in the channel forming step (Step 115), cutting is performed on the front surface of the actuator wafer 110 by a dicing blade and the like (not illustrated). Specifically, as illustrated in FIG. 14, the plurality of channels 54 and 55 are formed on the front surface of the actuator wafer 110, so as to be arranged in parallel at a distance in the X-direction. In this case, a region for forming each of the channels 54 and 55, on the front surface of the actuator wafer 110, is cut out in accordance with the above-described mask pattern 111.

Specifically, in the channel forming step (Step 115), the plurality of channels 54 and 55 are formed in the actuator wafer 110 so as to be arranged in parallel at a distance in the X-direction. The channels 54 and 55 include the extension portions 54a and 55a (see FIG. 5) which extend in the Z-direction, and the raise-and-cut portions 54b and 55b (see FIG. 5) which continue from the extension portions 54a and 55a toward one side of the Z-direction, and has a groove depth which is gradually reduced toward the one side of the Z-direction are formed.

The order of the mask pattern forming step (Step 110) and the channel forming step (Step 115) which are described above may be reversed so long as the mask pattern 111 can be formed to have a desired shape. In the above-described mask pattern forming step, the mask material at a portion positioned in a region of forming the discharge channels 54 and the non-discharge channels 55 may be removed in advance.

Figure 10C:
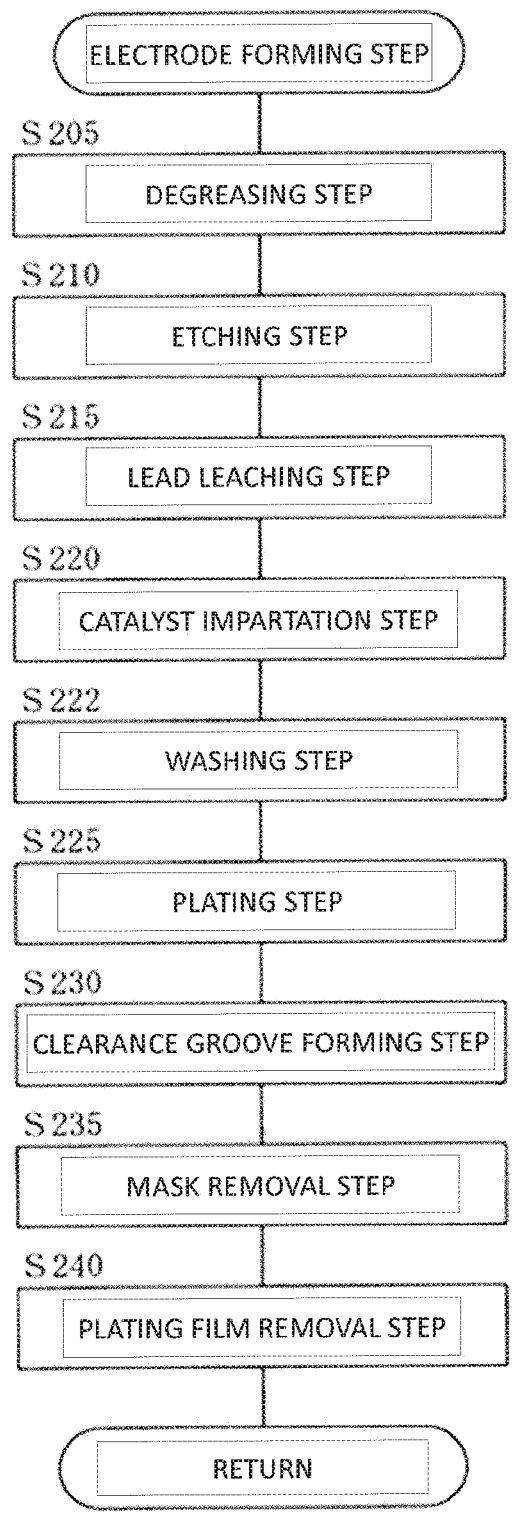

As illustrated in FIG. 10C, the electrode forming step (Step 120) includes a degreasing step (Step 205), an etching step (Step 210), a lead leaching step (Step 215), a catalyst impartation step (Step 220), a washing step (Step 222), a plating step (Step 225), a clearance groove forming step (Step 230), a mask removal step (Step 235), and a plating film removal step (Step 240).

In the degreasing step (Step 205), contaminants such as oils and fats, which are attached to the actuator wafer 110 are removed.

In the etching step (Step 210), the plating target surface on which the electrodes are formed is roughened by etching the actuator wafer 110 with an ammonium fluoride solution or the like (roughening step). Thus, it is possible to improve an adhesive force (caused by the anchor effect) between a plating film formed in the plating step, and the actuator wafer 110.

In the lead leaching step (Step 215), in a case where the actuator wafer 110 is formed of PZT, lead in the front surface of the actuator wafer 110 is removed. Thus, a catalyst suppression effect of lead on the surface of the actuator wafer 110 is suppressed.

Figure 15:
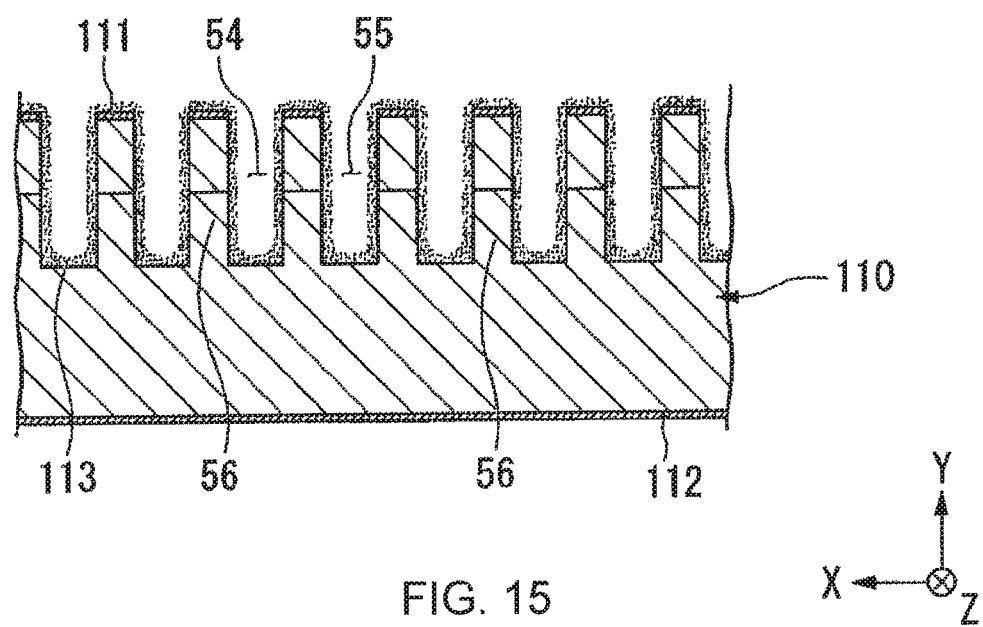
FIG. 15 is a step chart illustrating a catalyst impartation step in the embodiment.

For example, the catalyst impartation step (Step 220) is performed by a sensitizer and activator method. As illustrated in FIG. 15, in the sensitizer and activator method, firstly, a sensitization treatment in which the actuator wafer 110 is immersed in a stannous chloride aqueous solution so as to cause stannous chloride to be attracted to the actuator wafer 110 is performed. Then, the actuator wafer 110 is lightly washed by rinsing or the like. Then, the actuator wafer 110 is immersed in a palladium chloride aqueous solution, so as to cause palladium chloride to be attracted to the actuator wafer 110. If the immersing is performed, an oxidation-reduction reaction occurs between palladium chloride attracted to the actuator wafer 110 and stannous chloride which has been attracted in the above-described sensitization treatment. Thus, metal palladium as a catalyst 113 is precipitated (activating treatment). The catalyst impartation step may be performed plural number of times.

The catalyst impartation step may be performed by a method other than the above-described sensitizer and activator method. For example, the catalyst impartation step may be performed by a catalyst accelerator method. In the catalyst accelerator method, the actuator wafer 110 is immersed in a colloidal solution of tin and palladium. Then, the actuator wafer 110 is immersed in an acidic solution (for example, hydrochloric acid solution) so as to be activated. Thus, metal palladium is precipitated on the front surface of the actuator wafer 110.

With the catalyst impartation step, as illustrated in FIG. 15, the catalyst 113 (metal palladium) is precipitated on the entirety of the exposed surface which includes the mask pattern 111.

Then, the washing step (Step 222) is performed.

That is, rinsing for removing an unnecessary catalyst from the actuator wafer 110 in which the catalyst 113 is precipitated on the surface is performed.

In the embodiment, the plurality of channels 54 and 55 includes the extension portions 54a and 55a which extend in the Z-direction, and the raise-and-cut portions 54b and 55b which continue from the extension portions 54a and 55a toward one side of the Z-direction and has a groove depth which is gradually reduced toward the one side of the Z-direction. Thus, the plurality of channels 54 and 55 are formed to have a similar shape which has a common portion.

Therefore, in the washing step of the actuator wafer 110, since the similar amount of the washing liquid flows into the channel groove of each of the plurality of channels 54 and 55, it is possible to set the amounts of the removed unnecessary catalysts in both channel grooves to be substantially equal to each other. Thus, it is possible to suppress an occurrence of a situation in which a not-precipitated place is provided in a plating film or a plating lump is formed, by a difference of the degree of removing the unnecessary catalyst between the channel grooves.

Figure 16A:
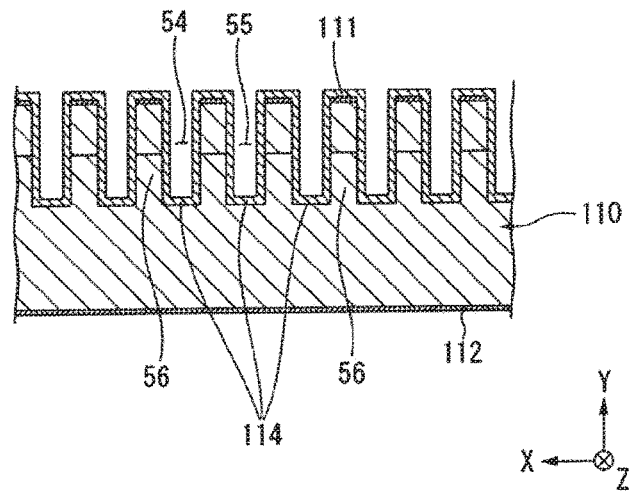
FIGS. 16A and 16B are step charts illustrating a plating step in the embodiment.

As illustrated in FIG. 16, in the plating step (Step 225), the actuator wafer 110 is immersed in a plating solution, for each mask pattern 111. If the actuator wafer 110 is immersed in the plating solution, a metal film 114 is formed at the portion of the actuator wafer 110, onto which the catalyst 113 is imparted, by precipitation. As electrode metal used in the plating step, for example, Ni (nickel), Co (cobalt), Cu (copper), Au (gold), and the like are preferable. In particular, Ni is preferably used.

Figure 16B:
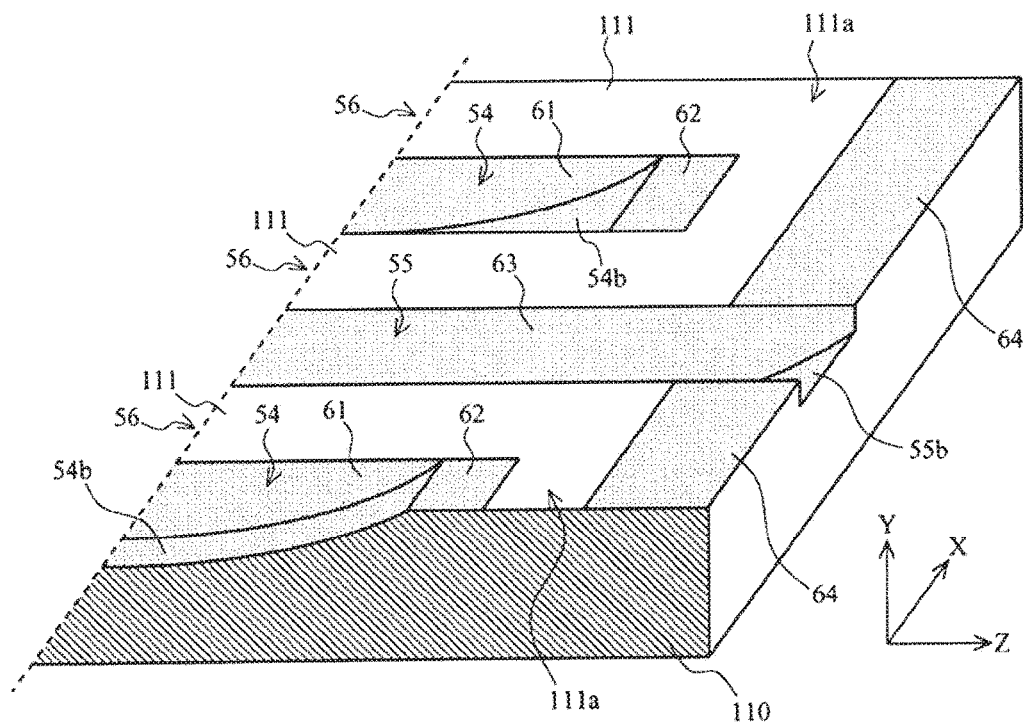

FIG. 16B illustrates a state where the metal film 114 is formed by precipitation in the plating step. In FIG. 16B, in order to clearly distinguish regions, shading is applied to a portion which functions as the metal electrode, and shading is not applied to the mask pattern 111 portion removed in the mask removal step which will be described later.

The mask pattern 111a also remains in a portion between a region provided as the AP-side common pad 62 and a region provided as the AP-side individual wiring 64. However, this portion coincides with a region (which will be described later) for forming the electrode clearance groove 81. However, the width of the mask pattern 111a may be narrower than that in FIG. 16B, that is, may be set to expand across the center side between both the regions provided as the AP-side common pad 62 and the AP-side individual wiring 64. In this case, since the electrode clearance groove 81 is formed to have a width which is wide than the width of the mask pattern 111a in the next clearance groove forming step, the regions of the AP-side common pad 62 and the AP-side individual wiring 64 are set to remain.

As illustrated in FIGS. 1 and 8, in the clearance groove forming step (Step 230), in the region of the AP-side tail portion 51e, the electrode clearance groove 81 is formed at a position over the bottom surface of the raise-and-cut portion 55b in the non-discharge channel 55 in the Y-direction, between the region provided as the AP-side common pad 62 and the region provided as the AP-side individual wiring 64.

The electrode clearance groove 81 is formed by cutting the surface of the actuator wafer 110 with a dicing blade or the like. Specifically, as illustrated in FIG. 1, the electrode clearance groove 81 is formed on the front surface of the actuator wafer 110 in the X-direction. In this case, the mask pattern 111 portions of the surface of the actuator wafer 110 are cut except for the region for forming the AP-side common pad 62 and the AP-side individual wiring 64.

Figure 17:
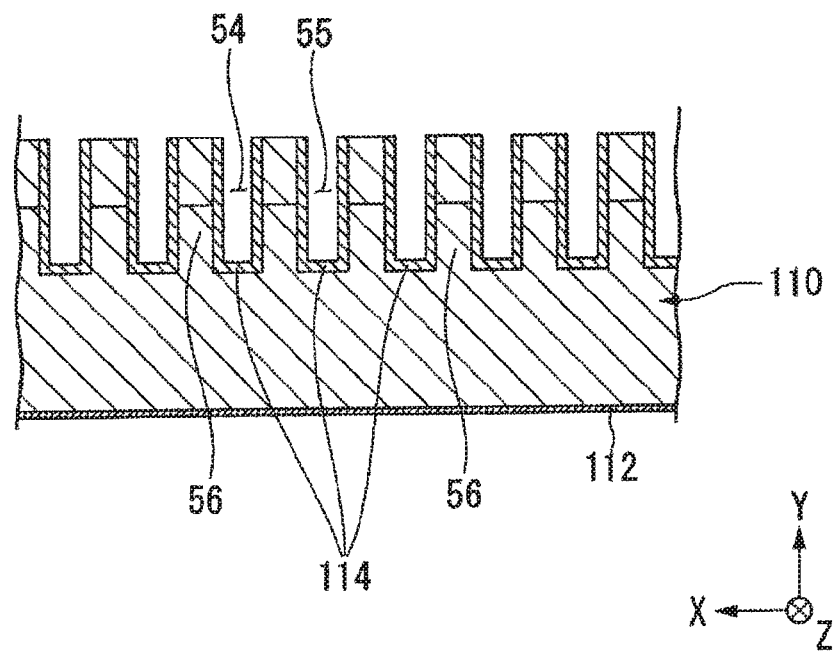
FIG. 17 is a step chart illustrating a mask removal step in the embodiment.

As illustrated in FIG. 17, in the mask removal step (Step 235), the mask pattern 111 formed on the front surface of the actuator wafer 110 is removed, for example, by lifting-off.

The metal film 114 formed on the mask pattern 111 by precipitation is removed along with the mask pattern 111.

Thus, a portion exposed from the mask pattern 111, that is, the common electrode 61 of the discharge channel 54 and the AP-side common pad 62 continuing to the common electrode 61 remain and the individual electrode 63 of the non-discharge channel 55 and the AP-side individual wiring 64 continuing to the individual electrode 63 remain, in the actuator wafer 110.

Figure 18:
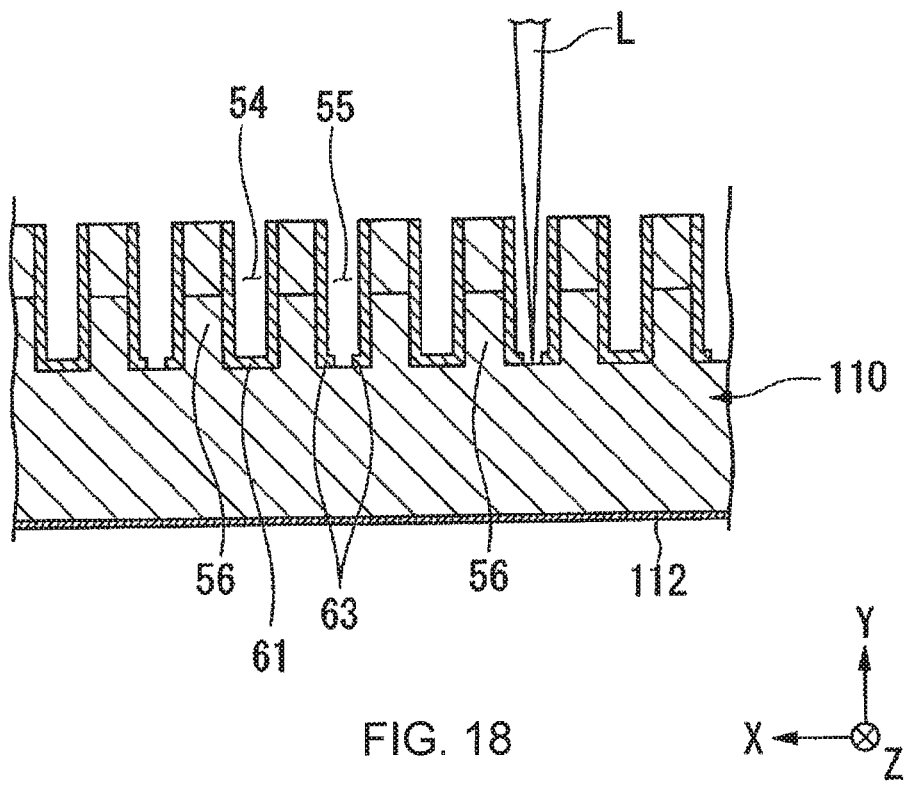
FIG. 18 is a step chart illustrating a plating film removal step in the embodiment.

As illustrated in FIG. 18, in the plating film removal step (Step 240), a portion of the metal film 114, which is positioned on the bottom surface of the non-discharge channel 55 is removed.

That is, in the non-discharge channel 55, as illustrated in FIG. 18, metal films 114 of both wall surfaces (facing each other) of two drive walls 56 are connected so as to be integrated on the bottom surface, and thus a state where the individual electrodes 63 are short-circuited occurs. Therefore, the individual electrodes 63 of both the wall surfaces are separated and insulated from each other by removing the whole length of the metal film on the bottom surface of the non-discharge channel 55 in the Z-direction.

Specifically, scanning with a laser beam L is performed in the Z-direction, in a state where the bottom surface of the non-discharge channel 55 is irradiated with the laser beam L. If the scanning is performed, a portion of the metal film 114 (see FIG. 16), which is irradiated with the laser beam L is selectively removed. Thus, the metal film 114 (see FIG. 16) is divided by the bottom surface of the non-discharge channel 55. Accordingly, in the actuator wafer 110, the common electrode 61 and the individual electrode 63 are respectively formed on the inner surfaces of the channels 54 and 55, respectively. The AP-side common pad 62 and the AP-side individual wiring 64 (see FIG. 8) which are respectively connected to the corresponding common electrode 61 and the corresponding individual electrode 63 are formed on the front surface of the actuator wafer 110.

Instead of the laser beam L, a dicer may be used. The plating film removal step is not limited to removing of the portion of the metal film 114, which is positioned on the bottom surface of the non-discharge channel 55. For example, in a catalyst removal step, a portion of the catalyst 113, which is positioned on the bottom surface of the non-discharge channel 55 may be removed. Specifically, in the catalyst removal step, scanning with a laser beam L may be performed in the Z-direction, in a state where the bottom surface of the non-discharge channel 55 is irradiated with the laser beam L. Thus, the portion of the catalyst 113, which is irradiated with the laser beam L may be selectively removed.

Then, in the cutting step (Step 122), the mounting tape 112 is peeled off, and the actuator wafer 110 is fragmented by using a dicer or the like. Accordingly, the above-described actuator plate 51 (see FIG. 8) is completed.

The head chip production step (Step 5) illustrated in the flowchart in FIG. 10A further includes a common ink room forming step, a slit forming step, a through-hole forming step, a recess portion forming step, and an electrode-and-wiring forming step, as steps for the cover plate side, in addition to the steps for the actuator plate 51 side, which are described above.

Figure 19:
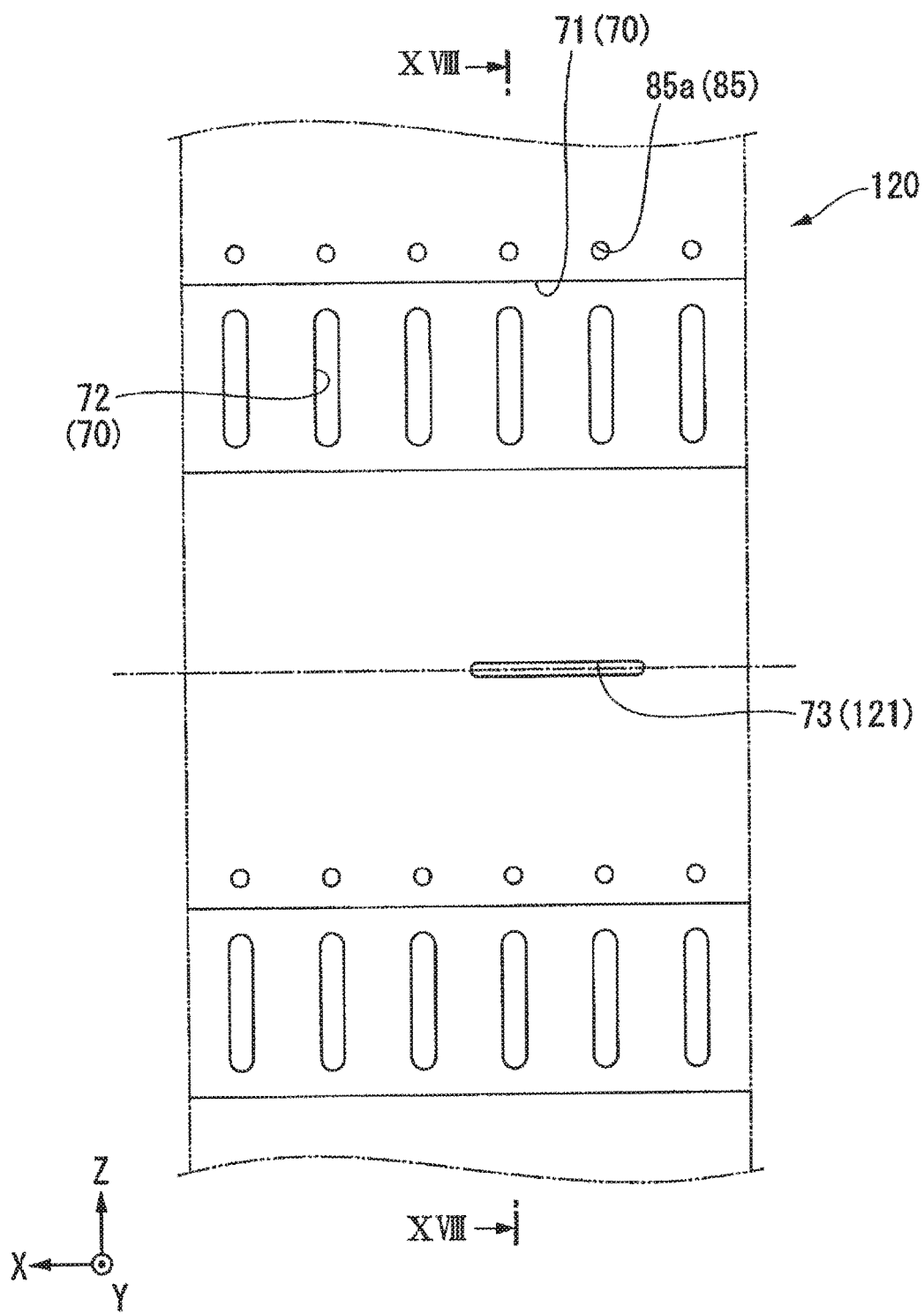
FIG. 19 is a step chart (plan view) illustrating a cover plate production step in the embodiment.

As illustrated in FIG. 19 in the common ink room forming step, sand blasting or the like is performed on a cover wafer 120 from the front surface side, through a mask (not illustrated), and thereby the common ink room 71 is formed.

Figure 20:
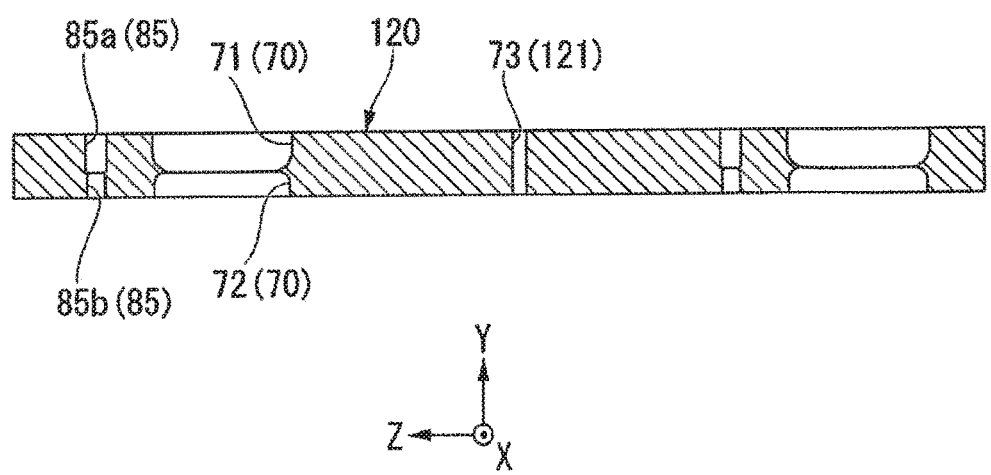
FIG. 20 is a view illustrating a section taken along XVIII-XVIII in FIG. 19.

As illustrated in FIG. 20, in the slit forming step, sand blasting or the like is performed on the cover wafer 120 from the back surface side, through a mask (not illustrated), and thereby slits 72 which individually communicate with the inside of the common ink room 71 are formed.

As illustrated in FIG. 19, in the through-hole forming step, sand blasting or the like is performed on a cover wafer 120 from the front surface side, through a mask (not illustrated), and thereby a front surface-side through-recess portion 85a is formed. The step of forming a front surface-side through-recess portion 85a may be performed in a step which is the same as the common ink room forming step.

As illustrated in FIG. 20, in the through-hole forming step, sand blasting or the like is performed on the cover wafer 120 from the back surface side, through a mask (not illustrated), and thereby a back surface-side through-recess portion 85b which individually communicates with the inside of the front surface-side through-recess portion 85a is formed. As described above, the front surface-side through-recess portion 85a is caused to communicate with the back surface-side through-recess portion 85b, and thereby the slit-like through-hole 87 is formed in the cover wafer 120. The step of forming a back surface-side through-recess portion 85b may be performed in a step which is the same as the slit forming step.

In the recess portion forming step, as illustrated in FIG. 19, sand blasting or the like is performed on the cover wafer 120 from the front surface side or the back surface side, through a mask (not illustrated), and thereby the slit 121 for forming the recess portion 73 (see FIG. 8) is formed. Then, cover wafer 120 is fragmented along an axis of the slit 121 by using a dicer or the like. Accordingly, the recess portion 73 is formed in the cover wafer 120. Thus, the cover plate 52 (see FIG. 4) in which the recess portion 73 is formed is completed.

Each of the common ink room forming step, the slit forming step, the through-hole forming step, and the recess portion forming step is not limited to sand blasting, and may be performed by dicing, cutting, or the like.

Figure 21:
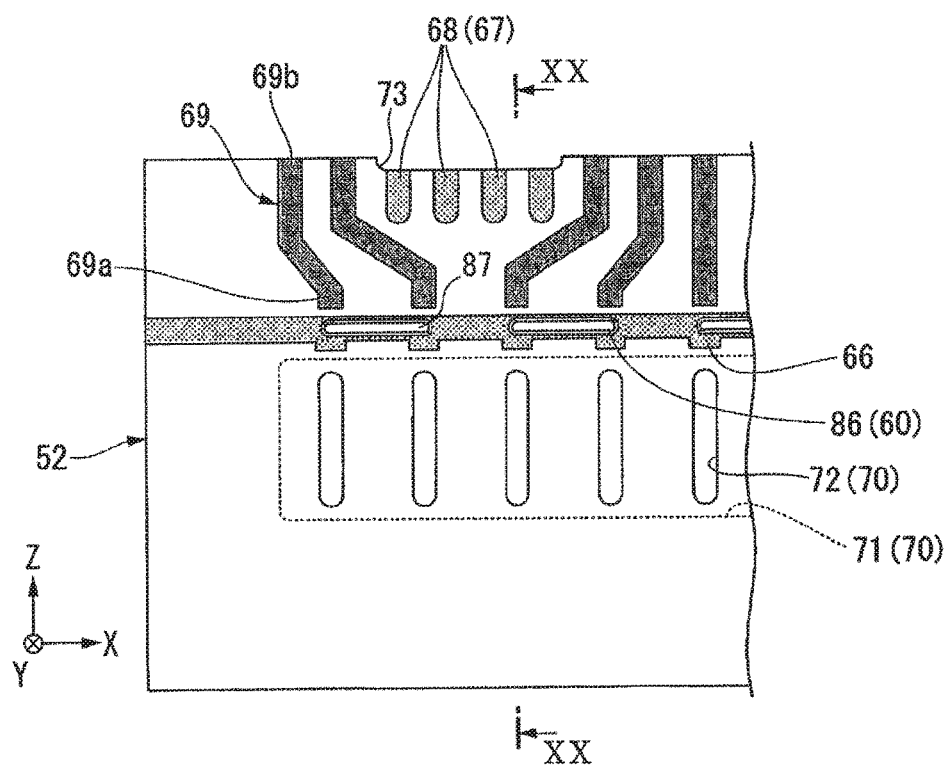
FIG. 21 is a diagram illustrating a common wiring forming step and an individual wiring forming step in the embodiment.

Then, as illustrated in FIG. 21, in the electrode-and-wiring forming step, various electrodes and wirings such as the in-through-hole electrode 86, the CP-side common pad 66, the common lead wiring 67, the joint common electrode 82 (see FIG. 22), and the CP-side individual wiring 69 are formed in the cover plate 52.

Figure 22:
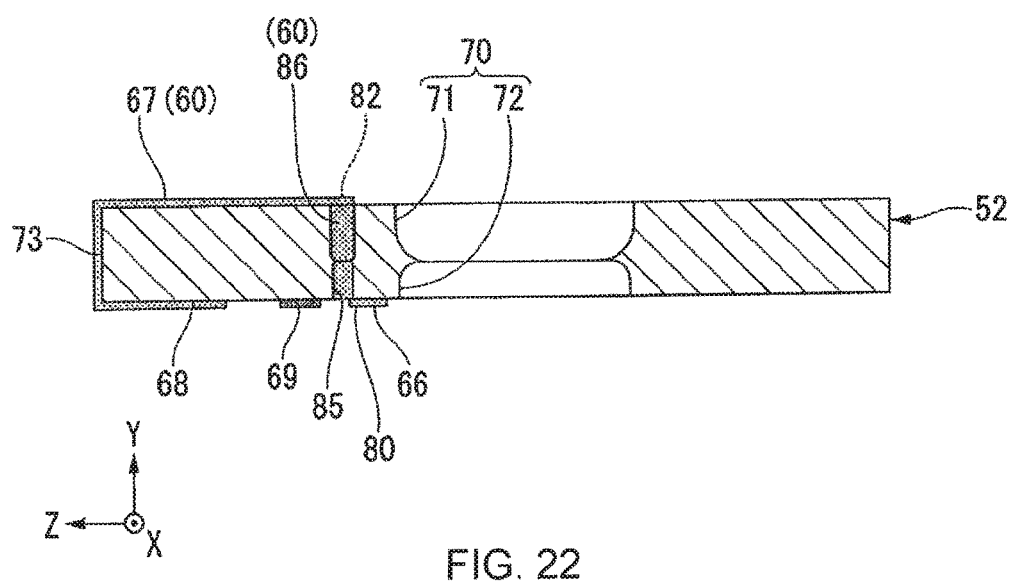
FIG. 22 is a view illustrating a section taken along XX-XX in FIG. 21.

Specifically, in the electrode-and-wiring forming step, as illustrated in FIG. 22, firstly, a mask (not illustrated) is disposed on the entire surface (including the front surface, the back surface, the upper end surface, a surface in which the recess portion 73 is formed, and a surface in which the through-hole 87 is formed) of the cover plate 52. In the mask, regions for forming various electrodes and various wirings (in-through-hole electrode 86, CP-side common pad 66, common lead wiring 67, joint common electrode 82, and CP-side individual wiring 69) are opened. Then, a film of an electrode material is formed on the entire surface of the cover plate 52 by electroless plating or the like. Thus, the film of the electrode material, which will function as the various electrodes and the various wirings is formed on the entire surface of the cover plate 52 through openings of the mask. As the mask, for example, a photosensitive dry film or the like may be used. The electrode-and-wiring forming step is not limited to plating, and may be performed by vapor deposition and the like. In a step of forming the in-through-hole electrode 86, the in-through-hole electrode 86 may be formed by filling the through-hole 87 with a conductive paste or the like.

After the electrode-and-wiring forming step ends, the mask is removed from the entire surface of the cover plate 52.

The actuator plates 51 are bonded to the cover plates 52, and thereby the head chips 40A and 40B are produced. Specifically, the AP-side-Y-direction inner side surface 51/1 is stuck to the CP-side-Y-direction outer side surface 52/1.

Flow-Passage Plate Production Step

In the embodiment, the flow-passage plate production step includes a flow passage forming step and a fragmentation step.

Figure 23:
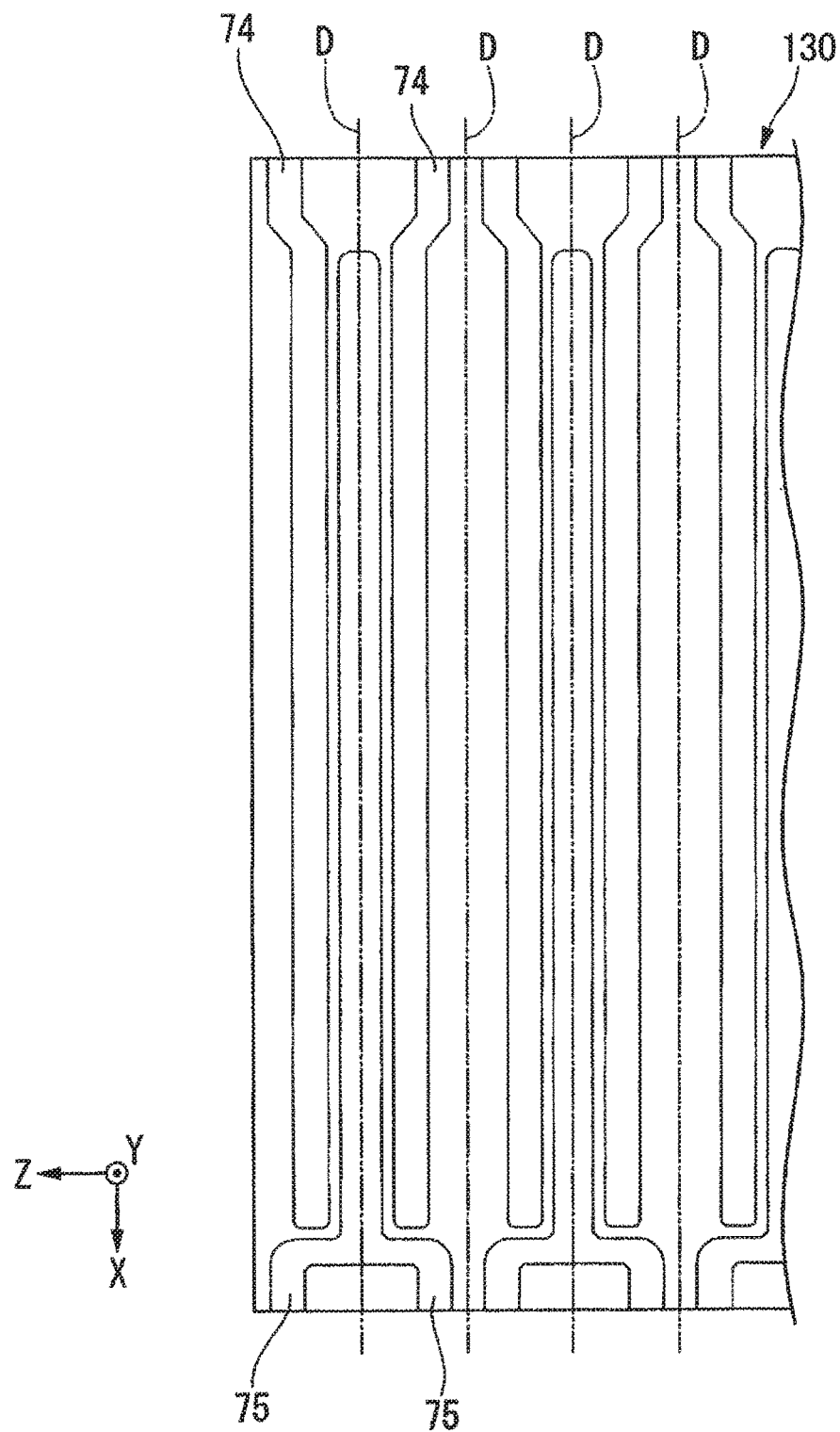
FIG. 23 is a diagram illustrating a flow-passage plate production step in the embodiment.
Figure 24:
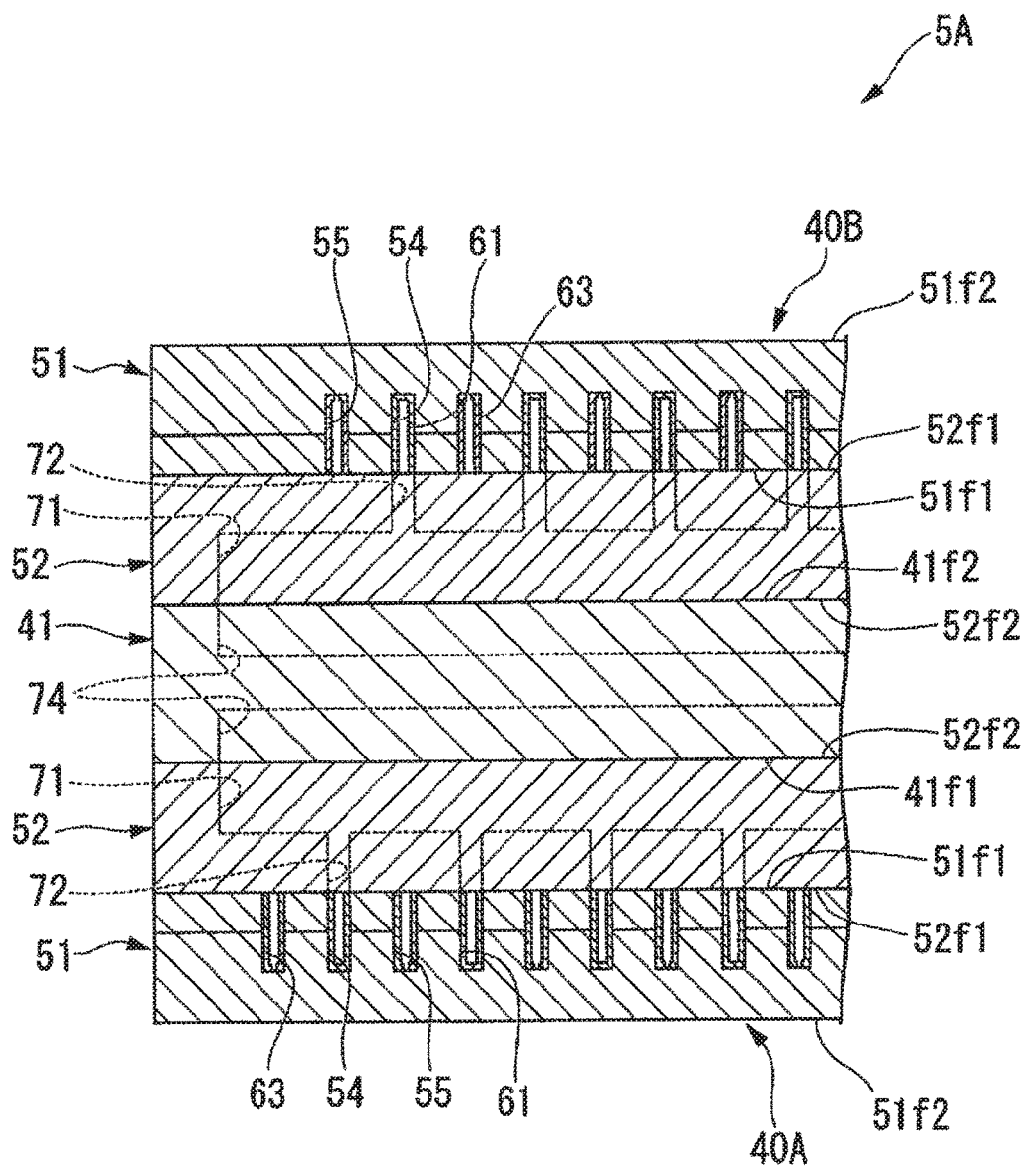
FIG. 24 is a view illustrating a section taken along XXII-XXII in FIG. 5, and is a step chart illustrating a various-plate bonding step.

As illustrated in FIG. 23, in the flow passage forming step (flow passage forming step of the front surface side), firstly, sand blasting or the like is performed on a flow passage wafer 130 from the front surface side, through a mask (not illustrated), and thereby the inlet flow passage 74 and the outlet flow passage 75 are formed.

In addition, in the flow passage forming step (flow passage forming step of the back surface side), sand blasting or the like is performed on the flow passage wafer 130 from the back surface side, through a mask (not illustrated), and thereby the inlet flow passage 74 and the outlet flow passage 75 are formed. Each of the steps in the flow passage forming step is not limited to sand blasting, and may be performed by dicing, cutting, and the like.

Then, in the fragmentation step, the flow passage wafer 130 is fragmented by using a dicer or the like. The fragmentation is performed along an axis (virtual line D) of a straight-line portion of the outlet flow passage 75 in the X-direction. Thus, the flow passage plate 41 (see FIG. 4) is completed.

Various-Plate Bonding Step

Then, as illustrated in FIG. 26, in the various-plate bonding step, the cover plates 52 in the head chips 40A and 40B are bonded to the flow passage plate 41. Specifically, the outer side surfaces (main surfaces 41/1 and 41/2) of the flow passage plate 41 in the Y-direction are stuck to CP-side-Y-direction inner side surfaces 52f2 of the head chips 40A and 40B.

Thus, a plate bonded body 5A is produced.

After all the plates in a wafer state are stuck to each other, chip division (fragmentation) may be performed.

Return-Plate-and-Like Bonding Step

Then, the return plate 43 and the nozzle plate 44 are bonded to the plate bonded body 5A. Then, the flexible substrate 45 (see FIG. 5) is mounted on the CP-side tail portion 52e.

With the above steps, the ink jet head 5 in the embodiment is completed.

According to the manufacturing method of an ink jet head in the embodiment, the discharge channel 54 and the non-discharge channel 55 are formed to respectively have the raise-and-cut portions 54b and 55b continuing to the extension portions 54a and 55a, that is, formed to have a similar shape.

Thus, not the electrode clearance groove 81 is previously formed, but the plating step is performed before the electrode clearance groove 81 is formed. Therefore, regarding the channel grooves for the discharge channel 54 and the non-discharge channel 55 having the similar shape, it is possible to cause a water flow to uniformly flow in the channels when washing is performed, and thus to avoid an occurrence of a situation in which a lump is formed in the groove for the channel by plating.

Therefore, it is possible to avoid degradation of yield occurring by forming a lump, and to reduce cost.

Further, in a manufacturing method in a modification example, when the electrode is formed by vapor deposition, the depth which allows forming an electrode has restrictions, and an electrode is not formed at a portion covered with a PZT grain boundary and the like. However, since an electrode is formed by plating, it is possible to more reliably connect electrodes.

Regarding the liquid ejecting head chip, the liquid ejecting head, the liquid ejecting apparatus, and the manufacturing method of a liquid ejecting head chip, Configurations (1) to (15) as follows can also be made based on the above-described embodiment.

(Configuration 1) A liquid ejecting head chip which includes an actuator plate in which a plurality of channels of which each includes an extension portion and a raise-and-cut portion extending in the first direction are arranged at a distance in a second direction which is orthogonal to a first direction, the raise-and-cut portion continuing from the extension portion toward one side of the first direction and has a groove depth which is gradually reduced toward the one side of the first direction, and in-channel electrode formed on an inner surface of each of the channels, with a plating film.

That is, the head chips 40A and 40B according to the embodiment include actuator plates 51 and the in-channel electrodes 61 and 63. In each of the actuator plates 51, a plurality of channels 54 and 55 are arranged at a distance in the X-direction. The channels 54 and 55 include the extension portions 54a and 55a which extend in the Z-direction, and the raise-and-cut portions 54b and 55b which continue from the extension portions 54a and 55a toward one side of the Z-direction and has a groove depth which is gradually reduced toward the one side of the Z-direction. The in-channel electrodes 61 and 63 are formed on the inner surface of each of the channels 54 and 55, with a plating film.

According to the examination of the inventors, a not-precipitated place may be provided in the plating film or a plating lump may be formed, in accordance with the shape of the channel (groove) in which an electrode is formed. In particular, in a case where the plurality of channels are configured by a channel which has a cut-off shape and includes only an extension portion which extends in the first direction, and a channel which includes a raise-and-cut portion, it is clear that a not-precipitated place is easily provided in the plating film or a plating lump is easily formed. The reason is as follows. Regarding rinsing for removing a catalyst which becomes unnecessary after the catalyst is imparted, the degree of the catalyst being removed varies depending on the shape of a plating target. Thus, if a condition for imparting the catalyst is adjusted in accordance with one shape, in a plating target having another shape, the required amount of the catalyst becomes insufficient by excessive rinsing, and thus a not-precipitated place may be provided in a plating film. Otherwise, a plating lump may be formed by insufficient rinsing. Therefore, in a case where an electrode is formed by plating, it is considered that a condition for performing plating on a target having a plurality of different shapes is difficult. This state becomes more significant, if nozzle density is increased and thus a groove width is reduced (for example, being equal to or smaller than 100 µm).

As a result of the close research, the inventors found the followings and achieved the present disclosure. That is, the frequency of a not-precipitated place being provided in a plating film or a plating lump being formed has high correlation with the shape of a channel. Thus, if the shapes of a plurality of channels are set to be shapes having a common portion, it is possible to suppress an occurrence of a situation in which a not-precipitated place is provided in a plating film or a plating lump is formed.

According to the embodiment, the plurality of channels 54 and 55 include the extension portions 54a and 55a which extend in the Z-direction, and the raise-and-cut portions 54b and 55b which continue from the extension portions 54a and 55a toward one side of the Z-direction and has a groove depth which is gradually reduced toward the one side of the Z-direction. Thus, the shapes of the plurality of channels 54 and 55 have a common portion. The in-channel electrodes 61 and 63 are formed with a plating film, on inner surfaces of the plurality of channels 54 and 55 having shapes which have a common portion. Thus, it is possible to suppress the occurrence of a situation in which a not-precipitated place is provided in a plating film or a plating lump is formed, in a plating electrode.

From a viewpoint of suppressing providing of a not-precipitated place in a plating film and forming of a plating lump, it is considered that each of the plurality of channels is set to be a channel having a cut-off shape. However, in a case where each of the plurality of channels is set to be a channel having a cut-off shape, cracks or chipping may occur in an actuator plate, in a step of forming a plating electrode.

On the contrary, according to the embodiment, the plurality of channels 54 and 55 include the raise-and-cut portions 54b and 55b. Thus, in comparison to a case where each of the plurality of channels is set to be a channel having a cut-off shape, this configuration is structurally robust. Accordingly, it is possible to suppress an occurrence of a situation in which cracks or chipping occurs in the actuator wafer 110, in the step of forming a plating electrode.

(Configuration 2) The liquid ejecting head chip in Configuration 1, in which the plurality of channels have shapes which are different from each other.

That is, in the embodiment, the plurality of channels 54 and 55 have shapes which are different from each other.

The shapes of a plurality of channels may be different from each other, in accordance with a type of ejecting a liquid from the plurality of channels. For example, the plurality of channels may be configured by a channel having a cut-off shape and a channel which includes a raise-and-cut portion. However, in this case, it is clear that a not-precipitated place is easily provided in a plating film or a plating lump is easily formed.

On the contrary, according to the embodiment, even in a case where the shapes of the plurality of channels 54 and 55 are different from each other, it is possible to suppress the occurrence of a situation in which a not-precipitated place is provided in a plating film or a plating lump is formed, in a plating electrode, because the plurality of channels 54 and 55 include the raise-and-cut portions 54b and 55b. In addition, it is possible to suppress the occurrence of a situation in which cracks or chipping occurs in the actuator plate 51.

(Configuration 3) The liquid ejecting head chip in Configuration 2, in which the plurality of channels include ejection channels and non-ejection channels which are alternately arranged in parallel at a distance in the second direction, the in-channel electrode includes a common electrode formed on an inner surface of each of the ejection channels and an individual electrode formed on an inner surface of each of the non-ejection channels, and the length of the non-ejection channel in the first direction is longer than the length of the ejection channel in the first direction.

That is, in the embodiment, the plurality of channels 54 and 55 include the discharge channels 54 and the non-discharge channels 55 which are alternately arranged in parallel at a distance in the X-direction. The in-channel electrodes 61 and 63 are the common electrode 61 formed on the inner surface of each of the discharge channels 54 and the individual electrode 63 formed on the inner surface of each of the non-discharge channels 55. The length of the non-discharge channel 55 in the Z-direction is longer than the length of the discharge channel 54 in the Z-direction.

According to the embodiment, in a type in which an ink is discharged from only the discharge channels 54 among the plurality of channels 54 and 55, it is possible to suppress the occurrence of a situation in which a not-precipitated place is provided in a plating film or a plating lump is formed, in a plating electrode. In addition, it is possible to suppress the occurrence of a situation in which cracks or chipping occurs in the actuator plate 51.

(Configuration 4) The liquid ejecting head chip in Configuration 3, further including a cover plate which is stacked on an actuator plate-side first main surface of the actuator plate in a third direction which is orthogonal to the first direction and the second direction, so as to close the ejection channels and the non-ejection channels in the actuator plate, and in which a liquid supply passage which communicates with the ejection channel and a through-hole which penetrates the cover plate in the third direction and is disposed at a place in which the liquid supply passage is not formed are formed, and a connection wiring that connects the common electrode to an external wiring through the through-hole in the cover plate.

That is, in the embodiment, the cover plate 52 which is stacked on the AP-side-Y-direction inner side surface 51f1 so as to close the discharge channels 54 and the non-discharge channels 55 and in which the liquid supply passage 70 which communicates with the discharge channels 54 and the through-hole 87 which penetrates the cover plate 52 in the Y-direction and is disposed at a place in which the liquid supply passage 70 is not formed are formed, and the connection wiring 60 which connects the common electrode 61 to the flexible substrate 45 through the through-hole 87 in the cover plate 52 are further included.

According to the embodiment, the through-hole 87 which penetrates the cover plate 52 in the Y-direction and is disposed at a place in which the liquid supply passage 70 is not formed is formed in the cover plate 52. The connection wiring 60 connects the common electrode 61 to the flexible substrate 45 through the through-hole 87. Thus, in comparison to a case where the common electrode 61 is formed in a flow passage for an ink, it is possible to reduce an occurrence of an electrode being provided in a place having a probability of the electrode being corroded. Accordingly, it is possible to suppress corrosion of an electrode due to a liquid such as an ink, and to improve reliability. In addition, in comparison to a case where the common electrode 61 is formed in a flow passage for an ink, it is possible to increase choices for electrode metal. For example, it is possible to use metal (for example, copper and silver) which is corroded by a liquid such as an ink, for the connection wiring (electrode) 60. In addition, it is possible to secure an area of a region in which the connection wiring 60 can be formed, without being influenced by grooves such as the discharge channels 54 and the non-discharge channels 55. In particular, the channel forming region can be more easily complicated in the configuration in which the discharge channels 54 and the non-discharge channels 55 are formed in the actuator plate 51, than in a configuration in which only ejection channels are formed. Thus, this is advantageous in that strength at a connection portion between various wirings is secure and the degree of freedom of layouts for the various wirings is improved. In addition, since the connection wiring 60 connects the common electrode 61 to the flexible substrate 45, in the cover plate 52, it is possible to suppress an increase of electrostatic capacity by separating the connection wiring 60 from the electrode on the actuator plate 51 side, in comparison to a configuration in which the connection wiring 60 is disposed on the actuator plate 51 side.

(Configuration 5) The liquid ejecting head chip in Configuration 4, in which the connection wiring is formed at a tail portion of the cover plate, which extends out of one end surface of the actuator plate in the first direction, in a stacked state of the actuator plate and the cover plate.

That is, the connection wiring 60 is formed at the CP-side tail portion 52e, in the stacked state of the actuator plate 51 and the cover plate 52.

According to the embodiment, it is possible to secure a wide area of the region in which the connection wiring 60 can be formed, in the CP-side tail portion 52e. Accordingly, it is easy to secure strength at a connection portion between various wirings, and to improve the degree of freedom of layouts for the various wirings.

(Configuration 6) The liquid ejecting head chip in Configuration 5, in which the connection wiring includes an in-through-hole electrode formed on an inner surface of the through-hole, and a lead wiring that connects the in-through-hole electrode to the external wiring at the tail portion of the cover plate.

That is, in the embodiment, the connection wiring 60 includes the in-through-hole electrode 86 formed on the inner surface of the through-hole 87 and the common lead wiring 67 which connects the in-through-hole electrode 86 to the flexible substrate 45 at the CP-side tail portion 52e.

According to the embodiment, it is possible to electrically connect the common electrode 61 to the flexible substrate 45 at a position which avoids the liquid supply passage 70, through the in-through-hole electrode 86 and the common lead wiring 67. Therefore, it is possible to avoid an occurrence of a situation in which the connection wiring 60 is brought into contact with a liquid such as an ink, which flows in the liquid supply passage 70.

(Configuration 7) The liquid ejecting head chip in Configuration 6, in which the lead wiring includes a common terminal which is formed to be divided into a plurality of parts of which the number is at least 3 or greater in the second direction on a cover plate-side first main surface which faces the actuator plate-side first main surface, and is connected to the external wiring, at the tail portion of the cover plate.

That is, in the embodiment, the common lead wiring 67 includes a common terminal 68 which is formed to be divided into a plurality of parts of which the number is at least 3 or greater in the X-direction, on the outer side surface of the CP-side tail portion 52e in the Y-direction. The common terminal 68 is connected to the flexible substrate 45.

According to the embodiment, since the common terminal 68 is formed on the outer side surface of the CP-side tail portion 52e in the Y-direction, it is possible to easily perform crimping work between the flexible substrate 45 and the common terminal 68, in comparison to a case where the common terminal 68 is formed on the CP-side-Y-direction inner side surface 52f2. In addition, since the common terminal 68 is formed to be divided into a plurality of parts of which the number is at least 3 or greater in the X-direction, it is possible to suppress an occurrence of dullness of a driving pulse, which occurs by a difference of a nozzle position in the X-direction, in comparison to a case where the common terminal 68 is partially formed (for example, at both ends of the cover plate in the X-direction).

(Configuration 8) The liquid ejecting head chip in Configuration 6 or 7, in which a plurality of actuator plate-side common pads which respectively extend from common electrodes and are disposed to be spaced from each other in the second direction are formed at a portion of the actuator plate-side first main surface, which is positioned on one side of the ejection channel in the first direction, and a plurality of cover plate-side common pads which extend from in-through-hole electrodes, are disposed to be spaced from each other in the second direction, and face the actuator plate-side common pads in the third direction are formed around through-holes in a cover plate-side first main surface of the cover plate, which faces the actuator plate-side first main surface, respectively.

That is, in the embodiment, the plurality of AP-side common pads 62 which extend from the common electrode 61 and are disposed to be spaced from each other in the X-direction are formed on the inner side surface of the AP-side tail portion 51e in the Y-direction. The plurality of CP-side common pads 66 which extend from the in-through-hole electrode 86, are disposed to be spaced from each other in the X-direction, and respectively face the AP-side common pads 62 in the Y-direction are formed around the through-hole 87 on the CP-side-Y-direction outer side surface 52f1.

According to the embodiment, when the actuator plate 51 and the cover plate 52 are bonded to each other, the AP-side common pad 62 can be connected to the CP-side common pad 66. Thus, it is possible to easily connect the common electrode 61 and the flexible substrate 45 via the pads 62 and 66 and the like. In addition, the common electrode 61 formed on the inner surface of each of the plurality of discharge channels 54 is conducted to the in-through-hole electrode 86 via the CP-side common pad 66 from the AP-side common pad 62, and the lead wiring 67 connected to the in-through-hole electrode 86 extends up to the CP-side tail portion 52e. Thus, it is possible to easily perform electrode arrangement of the common electrode 61 and the individual electrode 63.

(Configuration 9) The liquid ejecting head chip in Configuration 8, in which a transverse common electrode which is connected to the plurality of cover plate-side common pads and extends in the second direction is formed on the cover plate-side first main surface.

That is, in the embodiment, the AP-side individual wiring 64 which extends in the X-direction and connects individual electrodes 63 which face each other with the discharge channel 54 interposed between the individual electrodes 63 is formed on the inner side surface of the AP-side tail portion 51e in the Y-direction. The CP-side individual wiring 69 which is divided in the X-direction in one end portion in the Z-direction is formed on the CP-side-Y-direction outer side surface 52f1. The CP-side individual wiring 69 includes the CP-side individual pad 69a which faces the AP-side individual wiring 64 in the Y-direction, and the individual terminal 69b which extends upwardly from the CP-side individual pad 69a.

According to the embodiment, when the actuator plate 51 and the cover plate 52 are bonded to each other, the AP-side individual wiring 64 can be connected to the CP-side individual pad 69a. Thus, it is possible to easily connect the individual electrode 63 to the flexible substrate 45 via the individual wirings 64 and 69, the individual pad 69a, and the like. In the embodiment, both of the individual terminal 69b and the common terminal 68 are formed on the CP-side-Y-direction outer side surface 52f1. Thus, in comparison to a case where the individual terminal 69b and the common terminal 68 are formed on the surfaces of the cover plate 52, which are different from each other, it is possible to easily perform crimping work between the individual terminal 69b and the common terminal 68, and the flexible substrate 45.

(Configuration 10) The liquid ejecting head chip in any one of Configurations 4 to 9, in which an actuator plate-side individual wiring which extends in the second direction at one end portion thereof in the first direction and connects individual electrodes which face each other with the ejection channel interposed between the individual electrodes to each other is formed on the actuator plate-side first main surface, a cover plate-side individual wiring which is divided in the second direction at the one end portion thereof in the first direction is formed on the cover plate-side first main surface which faces the actuator plate-side first main surface in the cover plate, and the cover plate-side individual wiring includes a cover plate-side individual pad which faces the actuator plate-side individual wiring in the third direction, and an individual terminal which extends from the cover plate-side individual pad toward one end in the first direction.

That is, in the embodiment, the plurality of recess portions 73 which are recessed toward the inside of the cover plate 52 and are arranged to be spaced from each other in the X-direction are formed at the upper end of the CP-side tail portion 52e. The common lead wiring 67 is connected to the in-through-hole electrode 86 and the flexible substrate 45 along the recess portion 73.

Figure 25:
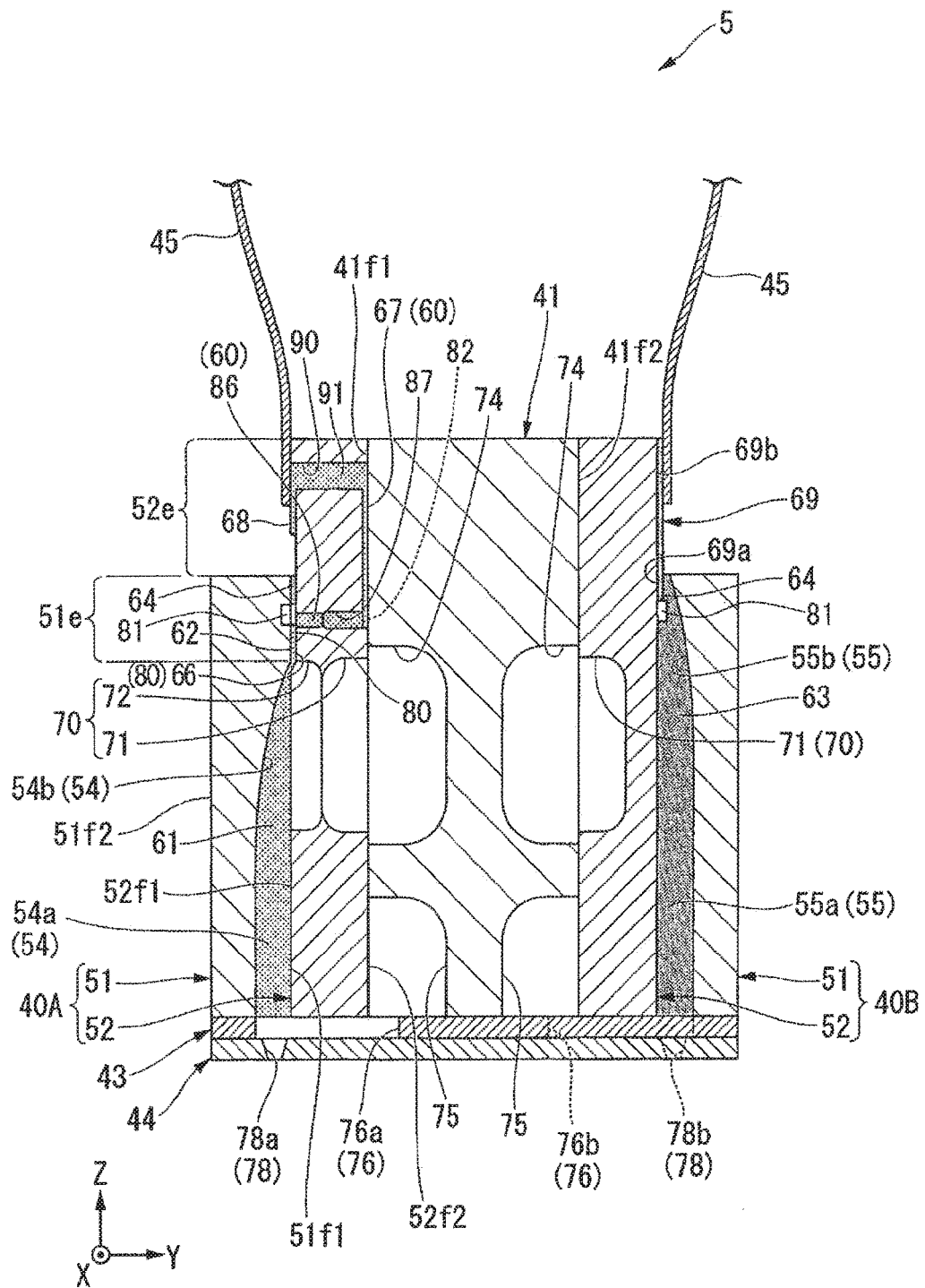
FIG. 25 is a sectional view illustrating an ink jet head in a modification example of the embodiment.

According to the embodiment, in comparison to a case where the common lead wiring 67 is connected to the in-through-hole electrode 86 and the flexible substrate 45 through the through-hole 90 (see FIG. 25), it is possible to reduce the length of the head chips 40A and 40B in the Z-direction because it is sufficient that a recess-portion forming region (for example, a region of forming the slit 121 illustrated in FIG. 19) which is smaller than a through-hole forming region (for example, a region of forming the through-hole 90 illustrated in FIG. 25) is formed in the cover plate 52. Therefore, it is possible to reduce the size of each of the head chips 40A and 40B, and to increase the number of pieces taken from a wafer having a predetermined size.

(Configuration 11) A liquid ejecting head including the liquid ejecting head chip in any one of Configurations 1 to 10.

That is, in the embodiment, the ink jet head 5 includes the head chips 40A and 40B.

According to the embodiment, in the ink jet head 5 which includes the head chips 40A and 40B, it is possible to suppress the occurrence of a situation in which a not-precipitated place is provided in a plating film or a plating lump is formed, in a plating electrode. In addition, it is possible to suppress the occurrence of a situation in which cracks or chipping occurs in the actuator plate 51.

(Configuration 12) The liquid ejecting head in Configuration 11, in which the plurality of channels include ejection channels and non-ejection channels which are alternately arranged at a distance in the second direction, the liquid ejecting head chip includes a cover plate which is stacked on an actuator plate-side first main surface of the actuator plate in a third direction which is orthogonal to the first direction and the second direction, so as to close the ejection channels and the non-ejection channels in the actuator plate, and in which a liquid supply passage which communicates with the ejection channel is formed, a pair of liquid ejecting head chips which is disposed such that a cover plate-side second main surface on a side of one cover plate, which is opposite to a cover plate-side first main surface which faces the actuator plate-side first main surface faces a cover plate-side second main surface on the side of the other cover plate in the third direction is provided, a flow passage plate is disposed between the pair of liquid ejecting head chips, and an inlet flow passage which communicates with liquid supply passages of the pair of the cover plates is formed in the flow passage plate.

That is, in the embodiment, a pair of head chips 40A and 40B is disposed to face CP-side-Y-direction inner side surfaces 52f2 to each other in the Y-direction are provided. The flow passage plate 41 is disposed between the pair of head chips 40A and 40B. The inlet flow passage 74 which communicates with liquid supply passages 70 of the pair of cover plates 52 is formed in the flow passage plate 41.

According to the embodiment, in each of the head chips 40A and 40B, the CP-side-Y-direction outer side surface 52f1 can be exposed to the outside thereof in the Y-direction. Thus, it is possible to easily connect the flexible substrate 45 to the connection wiring 60 in the two-row type ink jet head 5.

(Configuration 13) The liquid ejecting head in Configuration 12, in which each of the plurality of ejection channels is opened in the other end surface of the actuator plate in each of the pair of liquid ejecting head chips in the first direction, an ejection plate which has ejection holes which respectively communicate with the ejection channels is disposed on the other end side of each of the pair of actuator plates in the first direction, a return plate which has circulation passages which cause the ejection channels to respectively communicate with the ejection holes is disposed between the pair of actuator plates and the ejection plate in the first direction, and an outlet flow passage which communicates with the circulation passages is formed in the flow passage plate.

That is, in the embodiment, each of the plurality of discharge channels 54 is opened in the lower end surface of the actuator plate 51 in each of the pair of head chips 40A and 40B. The nozzle plate 44 which has nozzle holes 78 which respectively communicate with the discharge channels 54 is disposed on the lower end surface of each of the pair of actuator plates 51. The return plate 43 which has the circulation passages 76 which cause the discharge channels 54 to respectively communicate with the nozzle holes 78 is disposed between the pair of actuator plates 51 and the nozzle plate 44 in the Z-direction. The outlet flow passage 75 which communicates with the circulation passage 76 is formed in the flow passage plate 41.

According to the embodiment, it is possible to circulate a liquid between each of the discharge channels 54 and the ink tank 4. Thus, it is possible to suppress staying of bubbles in the vicinity of the nozzle hole 78 in the discharge channel 54.

(Configuration 14) A liquid ejecting apparatus including the liquid ejecting head in any one of Configuration 11 to 13, and a moving mechanism that relatively moves the liquid ejecting head and a recording medium.

That is, in the embodiment, the printer 1 includes the above-described ink jet head 5, and moving mechanisms 2, 3, and 7 that relatively move the ink jet head 5 and a recording medium P.

According to the embodiment, in the printer 1 which includes the ink jet head 5, it is possible to suppress the occurrence of a situation in which a not-precipitated place is provided in a plating film or a plating lump is formed, in a plating electrode. In addition, it is possible to suppress the occurrence of a situation in which cracks or chipping occurs in the actuator plate 51.

(Configuration 15) A manufacturing method of a liquid ejecting head chip including a channel forming step of forming a plurality of channels in an actuator wafer so as to be arranged in parallel at a distance in a second direction which is orthogonal to a first direction, each of the plurality of channels including an extension portion which extends in the first direction and a raise-and-cut portion which continues from the extension portion toward one side of the first direction and has a groove depth which is gradually reduced toward the one side of the first direction, and an electrode forming step of forming a plating film as an in-channel electrode, in an inner surface of each of the channels after the channel forming step.

That is, the manufacturing method of the head chips 40A and 40B in the embodiment includes the channel forming step of forming the plurality of channels 54 and 55 (which include the extension portions 54a and 55a which extend in the Z-direction and the raise-and-cut portions 54b and 55b which continue from the extension portions 54a and 55a toward one side of the Z-direction and has a groove depth which is gradually reduced toward the one side of the Z-direction) in the actuator wafer 110 so as to be arranged in parallel at a distance in the X-direction, and the electrode forming step of forming a plating film as the in-channel electrodes 61 and 63, on the inner surfaces of the channels 54 and 55, after the channel forming step.

According to this method, in the channel forming step, the plurality of channels 54 and 55 which include the extension portions 54a and 55a which extend in the Z-direction, and the raise-and-cut portions 54b and 55b which continue from the extension portions 54a and 55a toward one side of the Z-direction and has a groove depth which is gradually reduced toward the one side of the Z-direction are formed. Thus, the shapes of the plurality of channels 54 and 55 have a common portion. In the electrode forming step, the plating film is formed as the in-channel electrodes 61 and 63, in the inner surfaces of the plurality of channels 54 and 55 having shapes which have a common portion. Thus, it is possible to suppress the occurrence of a situation in which a not-precipitated place is provided in a plating film or a plating lump is formed, in a plating electrode. In addition, since the plurality of channels 54 and 55 respectively include the raise-and-cut portions 54b and 55b, this configuration is structurally robust, in comparison to a case where each of the plurality of channels is set to be a channel having a cut-off shape. Accordingly, it is possible to suppress an occurrence of a situation in which cracks or chipping occurs in the actuator wafer 110, in the electrode forming step.

The technical scope of the present invention is not limited to the above-described embodiment. Various modifications may be added in a range without departing from the gist of the present invention.

For example, in the above-described embodiment, as an example of the liquid ejecting apparatus, the ink jet printer 1 is described as an example. However, it is not limited to the printer. For example, a fax machine, an on-demand printer, and the like may be used as the liquid ejecting apparatus.

In the above-described embodiment, the two-row type ink jet head 5 in which two rows of nozzle holes 78 are arranged is described. However, it is not limited thereto. For example, an ink jet head 5 in which the number of rows of nozzle holes is equal to or greater than three may be provided, or an ink jet head 5 in which one row of nozzle holes is arranged may be provided.

In the above-described embodiment, among edge shoot type heads, a circulation type in which an ink is circulated between the ink jet head 5 and the ink tank 4 is described. However, it is not limited thereto. For example, the present invention may be applied to a so-called side shoot type ink jet head in which an ink is discharged from the center portion of a discharge channel in a channel extension direction.

In the above-described embodiment, a configuration in which the discharge channels 54 and the non-discharge channels 55 are alternately arranged is described. However, it is not limited to only this configuration. For example, the present invention may be applied to a so-called three-cycle type ink jet head in which an ink is discharged from all channels in order.

In the above-described embodiment, a configuration in which the Chevron type is used as the actuator plate is described. However, it is not limited thereto. That is, an actuator plate of a monopole type (polarization direction is one in the thickness direction) may be used.

In the above-described embodiment, a configuration in which the plurality of channels 54 and 55 have shapes which are different from each other is described. However, it is not limited thereto. That is, the plurality of channels 54 and 55 may have the same shape.

In the above-described embodiment, a configuration in which the length of the non-discharge channel 55 in the Z-direction is longer than the length of the discharge channel 54 in the Z-direction is described. However, it is not limited thereto. For example, the length of the non-discharge channel 55 in the Z-direction may be equal to or smaller than the length of the discharge channel 54 in the Z-direction.

In the above-described embodiment, a configuration in which the joint common electrode 82 which is connected to the plurality of common lead wirings 67 is formed on the CP-side-Y-direction inner side surface 52f2 is described. However, it is not limited thereto. For example, the joint common electrode 82 may not be formed on the CP-side-Y-direction inner side surface 52f2. That is, a portion between two common lead wirings 67 which are adjacent to each other may be not electrically connected to a portion between another two common lead wirings 67 which are adjacent to each other, on the CP-side-Y-direction inner side surface 52f2.

In the above-described embodiment, a configuration in which the flow passage plate 41 is integrally formed of the same member is described. However, it is not limited to only this configuration. For example, the flow passage plate 41 may be formed by an assembly of a plurality of members.

In the following modification examples, components which are the same as those in the embodiment are denoted by the same reference signs, and descriptions thereof will not be repeated.

Modification Example

For example, as illustrated in FIG. 25, instead of the recess portion 73 (see FIG. 5) in the embodiment, a plurality of through-holes 90 may be formed at the upper end portion of the cover plate 52. The through-holes penetrate in the Y-direction and are arranged to be spaced from each other in the X-direction.

The common lead wiring 67 extends upwardly on the CP-side-Y-direction inner side surface 52f2 from the through-hole 87 along the CP-side-Y-direction inner side surface 52f2. Then, the common lead wiring 67 is drawn up to the upper end portion of the CP-side-Y-direction outer side surface 52f1 through the through-hole 90 at the upper end portion of the cover plate 52. In other words, the common lead wiring 67 is drawn up to the outer side surface of the CP-side tail portion 52e in the Y-direction, through a through-electrode 91 in the through-hole 90. Thus, the common electrode 61 formed on the inner surface of each of the plurality of discharge channels 54 is electrically connected to the flexible substrate 45 at the common terminal 68, through the AP-side common pad 62, the CP-side common pad 66, the in-through-hole electrode 86, and the common lead wiring 67.

For example, the through-electrode 91 is formed only on an inner circumferential surface of the through-hole 90 by vapor deposition or the like. The through-hole 90 may be filled with the through-electrode 91 by using a conductive paste or the like.

In this modification example, the plurality of through-holes 90 which penetrate the cover plate 52 in the Y-direction and are arranged to be spaced from each other in the X-direction are formed at the upper end portion of the CP-side tail portion 52e. The common lead wiring 67 is connected to the in-through-hole electrode 86 and the flexible substrate 45 through the through-hole 90.

According to this modification example, in comparison to a case where the common lead wiring 67 is connected to the in-through-hole electrode 86 and the flexible substrate 45 through the recess portion 73 (see FIG. 5), it is possible to protect the common lead wiring 67 by a through-hole forming portion (wall portion). Thus, the common lead wiring 67 in the through-hole 90 can be avoided from being damaged.

In addition, in the range without departing from the gist of the present invention, the components in the above-described embodiment may be appropriately substituted with known components, or the above-described modification examples may be appropriately combined.

What is claimed is:

1. A manufacturing method of a liquid ejecting head chip which includes an actuator plate in which parts are formed on an actuator plate-side first main surface directed toward a third direction among a first direction, a second direction, and the third direction being orthogonal to one another, and a cover plate bonded to the actuator plate-side first main surface of the actuator plate, wherein the parts of the actuator plate include
a plurality of ejection channels and non-ejection channels which are formed in the first direction and are alternately arranged at a distance in the second direction,
a common electrode formed on an inner circumferential surface of each of the ejection channels with a plating film,
an individual electrode formed on both side surfaces of an inner side of each of the non-ejection channels, with the plating film,
a plurality of actuator plate-side common pads which are formed on the actuator plate-side first main surface with the plating film, extend from common electrodes, and are disposed to be spaced from each other in the second direction, respectively, in a portion positioned on one side relative to the ejection channels in the first direction,
an actuator plate-side individual wiring which is formed on the actuator plate-side first main surface with the plating film and connects individual electrodes facing each other with one of the ejection channels interposed between the individual electrodes, and
an electrode clearance groove formed in the second direction between the actuator plate-side common pads and the actuator plate-side individual wiring, on one side of the actuator plate in the first direction, and the method comprises:
a mask pattern forming step of forming a mask pattern for the actuator plate-side common pads and the actuator plate-side individual wirings, on the actuator plate-side first main surface of the actuator plate;
a channel groove forming step of forming channel grooves of the ejection channels and the non-ejection channels at a portion of the actuator plate-side first main surface, at which the mask pattern is formed, by cutting;
a plating step of forming a plating film by performing catalyst impartation, washing, and plating on the actuator plate on which cutting is performed in the channel groove forming step, so as to integrally form the common electrode, the individual electrode, the actuator plate-side common pads, and the actuator plate-side individual wirings;
a clearance groove forming step of forming the electrode clearance groove between the actuator plate-side common pads and the actuator plate-side individual wirings which are integrally formed in the plating step, on the actuator plate-side first main surface, by cutting; and
an individual electrode separation step of separating individual electrodes formed on both side surfaces facing each other, from each other on the inner side of the non-ejection channel.

2. The manufacturing method of a liquid ejecting head chip according to claim 1,
wherein the plating step includes a roughening step of roughening a surface on which the plating film is to be formed, before the plating film is formed.

3. The manufacturing method of a liquid ejecting head chip according to claim 1,
wherein, in the channel groove forming step, the channel groove which includes an extension portion extending in the first direction, and a raise-and-cut portion continuing from the extension portion toward one side of the first direction and having a groove depth which gradually becomes shallow while being raised toward the one side of the first direction is formed by cutting.

4. The manufacturing method of a liquid ejecting head chip according to claim 2,
wherein, in the channel groove forming step, the channel groove which includes an extension portion extending in the first direction, and a raise-and-cut portion continuing from the extension portion toward one side of the first direction and having a groove depth which gradually becomes shallow while being raised toward the one side of the first direction is formed by cutting.

* * * * *